United States Patent
Su

(10) Patent No.: US 12,230,542 B2
(45) Date of Patent: Feb. 18, 2025

(54) METHOD FOR DICING A SEMICONDUCTOR WAFER STRUCTURE

(71) Applicant: Taiwan Semiconductor Manufacturing Company, Ltd., Hsinchu (TW)

(72) Inventor: Shu-Hui Su, Tucheng (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 387 days.

(21) Appl. No.: 17/709,696

(22) Filed: Mar. 31, 2022

(65) Prior Publication Data

US 2023/0317521 A1    Oct. 5, 2023

(51) Int. Cl.
*H01L 21/78*    (2006.01)
*H01L 23/544*    (2006.01)

(52) U.S. Cl.
CPC ........... *H01L 21/78* (2013.01); *H01L 23/544* (2013.01); *H01L 2223/5448* (2013.01)

(58) Field of Classification Search
CPC ..... H01L 23/544; H01L 23/562; H01L 25/50; H01L 2223/5448; H01L 21/78–786; H01L 21/3043; B28D 5/022–029
See application file for complete search history.

(56) References Cited

U.S. PATENT DOCUMENTS

| | | | |
|---|---|---|---|
| 2007/0134833 A1* | 6/2007 | Ikemoto | H01L 33/0095 438/33 |
| 2013/0119552 A1 | 5/2013 | Lin et al. | |
| 2018/0166328 A1* | 6/2018 | Tang | H01L 24/20 |
| 2020/0395246 A1* | 12/2020 | Schneider | H01L 21/78 |

FOREIGN PATENT DOCUMENTS

TW    201322319 A    6/2013

* cited by examiner

*Primary Examiner* — Shahed Ahmed
(74) *Attorney, Agent, or Firm* — Eschweiler & Potashnik, LLC

(57) ABSTRACT

The present disclosure relates to a method for forming an integrated chip. The method includes performing a first dicing cut along a first direction and extending into a semiconductor substrate from a first side of the semiconductor substrate. The method includes performing a second dicing cut along the first direction and extending into the semiconductor substrate from a second side of the semiconductor substrate, opposite the first side. The method includes performing a third dicing cut, separate from the second dicing cut, along the first direction and extending into the semiconductor substrate from the second side of the semiconductor substrate.

20 Claims, 17 Drawing Sheets

METHOD FOR DICING A SEMICONDUCTOR WAFER STRUCTURE

BACKGROUND

Many modern electronic devices use integrated circuits that are formed on semiconductor wafers during semiconductor device fabrication processes. After forming integrated circuits on the semiconductor wafers, the semiconductor wafers may be diced into individual semiconductor die. In many processes, dicing includes cutting a semiconductor wafer into the semiconductor die with a dicing blade.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
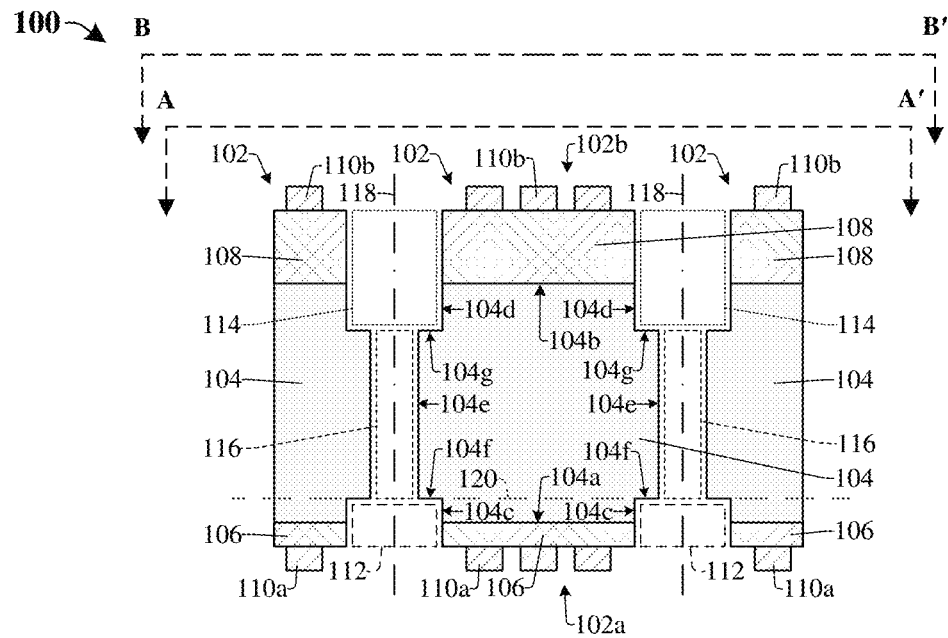
FIG. 1 illustrates a cross-sectional view of some embodiments of a semiconductor wafer structure including plurality of semiconductor die that are separated by first dicing cut regions, second dicing cuts regions, and third dicing cuts regions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor fabrication, a plurality of individual integrated circuits may be formed on a semiconductor wafer. The semiconductor wafer may include a semiconductor substrate, a first dielectric structure (e.g., including one or more first dielectric layers) on a first side of the substrate, and a second dielectric structure (e.g., including one or more second dielectric layers) on a second side of the substrate, opposite the first side. The semiconductor wafer may be diced along scribe lines to separate the individual integrated circuits from each other. In some dicing processes, the dicing includes performing a first dicing cut and a second dicing cut with a dicing blade along a scribe line. The first dicing cut extends from a first side of the wafer through the first dielectric structure and into the semiconductor substrate to a first depth that is less than a total thickness of the semiconductor substrate. The second dicing cut extends from the first depth through a remainder of the semiconductor substrate and through the second dielectric structure to a second side of the wafer, opposite the first side of the wafer. The dicing (e.g., the first and second cuts) is performed along a plurality of vertical and horizontal scribe lines to dice the wafer into a plurality of semiconductor die.

A challenge with these dicing processes is that the semiconductor die may be damaged (e.g., may chip, crack, etc.) when the second dicing cut is performed. For example, the final cut interface (e.g., the point where the dicing blade cuts through the last portion of material before breakthrough) may experience increased stress from the dicing blade during dicing, and because the second dicing cut extends through the second dielectric structure last, the final cut interface is at the second dielectric structure. Further, the dielectric material of the second dielectric structure and the first dielectric structure may have an increased susceptibility to damage (e.g., chipping) during dicing. Thus, because the final cut interface is at the second dielectric structure, and because the second dielectric structure has an increased susceptibility to damage during dicing, a likelihood of the second dielectric structure being damaged during the second dicing cut may be increased. As a result, a yield of reliable semiconductor die from the semiconductor wafer structure may be reduced.

Various embodiments of the present disclosure are related to a method for dicing a semiconductor wafer structure into semiconductor die with a reduced likelihood for damage. The method includes performing a first dicing cut along a scribe line. The first dicing cut extends through a first dielectric structure of the semiconductor wafer structure and into a semiconductor substrate of the semiconductor wafer structure from a first side of the semiconductor wafer structure. A second dicing cut is performed along the scribe line. The second dicing cut extends through a second dielectric structure of the semiconductor wafer structure and into the semiconductor substrate from a second side of the semiconductor wafer structure, opposite the first side. A third dicing cut is performed along the first scribe line. The third dicing cut extends through a remainder of the semiconductor substrate from the second side of the semiconductor wafer structure to the first side of the semiconductor wafer structure.

By performing the first dicing cut through the first dielectric structure and into the semiconductor substrate before performing the third dicing cut through the remainder of the semiconductor substrate, a likelihood of damage (e.g., chipping or the like) occurring to the semiconductor die during dicing may be reduced. For example, because the first dicing cut extends through the first dielectric structure and into the semiconductor substrate from the second side of the wafer structure before the third dicing cut extends through the remainder of the semiconductor substrate from the first side of the wafer structure to the second side of the wafer structure, the final cut interface is at the semiconductor substrate—not at the first or second dielectric structures—which has a reduced susceptibility to damage (e.g., relative to the first and second dielectric structures). Thus, a likelihood of damage occurring during the dicing may be reduced. As a result, a yield of reliable semiconductor die from the semiconductor wafer structure may be improved.

Figure 2:
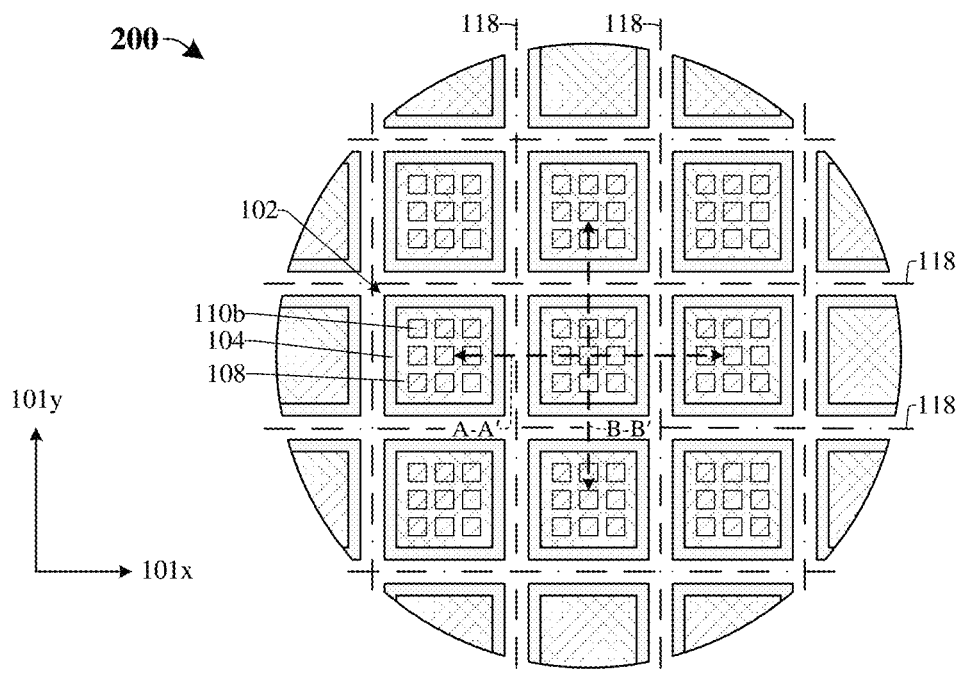
FIG. 2 illustrates a top view of some embodiments of the semiconductor wafer structure of FIG. 1.
Figure 3:
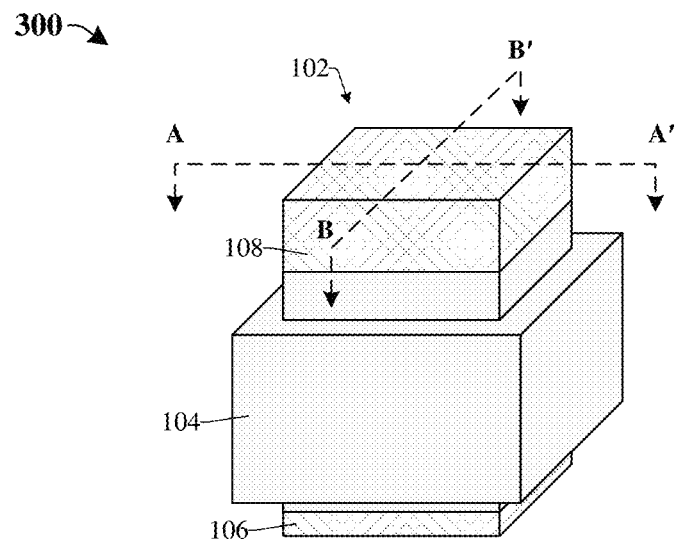
FIG. 3 illustrates a three-dimensional view of some embodiments of the semiconductor wafer structure of FIG. 1.

FIG. 1 illustrates a cross-sectional view 100 of some embodiments of a semiconductor wafer structure including plurality of semiconductor die 102 that are separated by first dicing cut regions 112, second dicing cut regions 114, and third dicing cut regions 116. FIG. 2 illustrates a top view 200 of some embodiments of the semiconductor wafer structure of FIG. 1. In some embodiments, the cross-sectional view 100 illustrated in FIG. 1 may, for example, be taken across line A-A' or line B-B' of FIG. 2. FIG. 3 illustrates a three-dimensional view 300 of some embodiments of the semiconductor wafer structure of FIG. 1. FIG. 3 illustrates a single semiconductor die 102 without conductive features 110a, 110b, for simplicity of illustration.

Referring to FIG. 1, FIG. 2, and FIG. 3, a semiconductor die 102 of the semiconductor wafer structure includes a semiconductor substrate 104, a first dielectric structure 106 (e.g., comprising one or more first dielectric layers) on a first side 104a of the substrate 104, and a second dielectric structure 108 (e.g., comprising one or more second dielectric layers) on a second side 104b of the substrate 104, opposite the first side 104a. A first plurality of conductive features 110a (e.g., bond pads, solder bumps, terminals, electrodes, or the like) are arranged on the first dielectric structure 106. A second plurality of conductive features 110b (e.g., bond pads, solder bumps, terminals, electrodes, or the like) are arranged on the second dielectric structure 108.

Scribe lines 118 extend between the semiconductor die 102. The scribe lines 118 extend along a first direction 101y and a second direction 101x, different from the first direction 101y. For example, the first direction 101y may be approximately perpendicular to the second direction 101x. A first dicing cut, a second dicing cut, and a third dicing cut are performed along a scribe line 118 to separate the semiconductor wafer structure along that scribe line 118. The first dicing cut extends from a first side 102a of the semiconductor wafer structure through first dielectric structure 106 and into the first side 104a of the substrate 104, as illustrated by the first dicing cut regions 112. The second dicing cut extends from a second side 102b of the semiconductor wafer structure through the second dielectric structure 108 and into the second side 104b of the substrate 104, as illustrated by the second dicing cut regions 114. The third dicing cut extends through the substrate 104 from the second side 104b to the first side 104a, as illustrated by the third dicing cut regions 116. The final cut interface before separation (e.g., the last region to be cut before breakthrough) is illustrated by dashed line 120.

In some embodiments, depths of the first dicing cut regions 112 (e.g., depths of the first dicing cuts) are greater than a thickness of the first dielectric structure 106 and less than a total thickness of the substrate 104. In other words, the first dicing cut regions 112 extend through the first dielectric structure 106 and into the substrate 104, but not through a total thickness of the substrate 104. In some embodiments, depths of the first dicing cut regions 112 are greater than about 5% of the total thickness of the semiconductor wafer structure and less than about 30% of the total thickness of the semiconductor wafer structure, or some other suitable depths.

By performing the first dicing cut into the substrate 104 from the first side 102a of the semiconductor wafer structure before performing the third dicing cut through the substrate 104 from the second side 102b of the semiconductor wafer structure to the first side 102a of the semiconductor wafer structure, a likelihood of damage occurring along the semiconductor die 102 during dicing may be reduced. For example, because the first dicing cut extends through the first dielectric structure 106 and into the first side 104a of the substrate 104 before the third dicing cut extends through the substrate 104 from the second side 104b to the first side 104a, the final cut interface is at the substrate 104 instead of at the first dielectric structure 106 or the second dielectric structure 108. Further, the semiconductor material(s) of the substrate 104 has a reduced susceptibility to damage relative to the dielectric material(s) of the first dielectric structure 106 and the second dielectric structure 108. Thus, a likelihood of damage (e.g., chipping along the final cut interface) occurring during the dicing may be reduced. As a result, a yield of reliable die from the semiconductor wafer structure may be improved. For example, a yield may be increased by 5% or more, 10% or more, 15% or more, or some other percentage.

In some embodiments, the substrate 104 has a first pair of opposing sidewalls 104c, a second pair of opposing sidewalls 104d, and a third pair of opposing sidewalls 104e as a result of the first dicing cut, the second dicing cut, and the third dicing cut, respectively. The second pair of opposing sidewalls 104d are laterally offset from the third pair of opposing sidewalls 104e. In some embodiments, the first pair of opposing sidewalls 104c are laterally offset from the third pair of opposing sidewalls 104e. In some embodiments, the first pair of opposing sidewalls 104c, the second pair of opposing sidewalls 104d, and the third pair of opposing sidewalls 104e are outermost sidewalls of the substrate 104 and the semiconductor die 102 and delimit a boundary of the substrate 104 and the semiconductor die 102.

In some embodiments, the substrate 104 has a lower cut surface 104f above the lowermost surface (e.g., 104a) of the substrate 104 and an upper cut surface 104g below the uppermost surface (e.g., 104b) of the substrate 104 as a result of the dicing cuts. The upper cut surface 104g extend between bottoms of the second pair of opposing sidewalls 104d and tops of the third pair of opposing sidewalls 104e. The lower cut surface 104f extends between bottoms of the third pair of opposing sidewalls 104e and tops of the first pair of opposing sidewalls 104c. The first pair of opposing sidewalls 104c extend between the first side 104a of the substrate 104 and the lower cut surface 104f. The second pair of opposing sidewalls 104d extend between the second side 104b of the substrate 104 and the upper cut surface 104g. The third pair of opposing sidewalls 104e extend between the upper cut surface 104g and the lower cut surface 104f. The upper cut surface 104g is directly over the lower cut surface 104f.

The first dielectric structure 106 has a pair of opposing sidewalls (not labeled) that are aligned with the first pair of opposing sidewalls 104c of the substrate 104. The second dielectric structure 108 has a pair of opposing sidewalls (not labeled) that are aligned with the second pair of opposing sidewalls 104d of the substrate 104.

Figure 6:
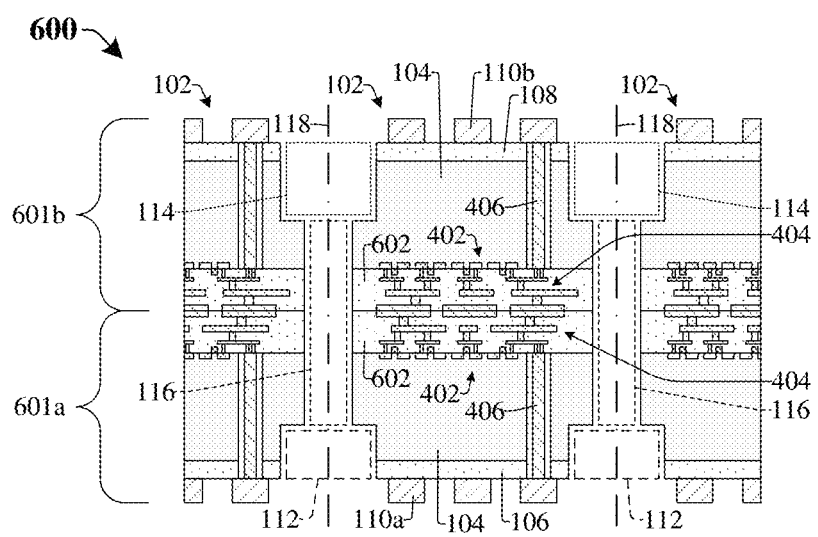

Although the substrate 104 is shown in FIG. 1 as one continuous layer, it will be appreciated that in some embodiments (e.g., as shown in FIG. 6), the substrate 104 can alternatively have multiple portions with one or more dielectric layers arranged therebetween.

In some embodiments, the substrate 104 may, for example, comprises silicon, silicon germanium, gallium arsenide, or some other suitable semiconductor. In some embodiments, the first dielectric structure 106 comprises a first dielectric and the second dielectric structure 108 comprises a second dielectric, different from the first dielectric. In some other embodiments, the first dielectric structure 106 and the second dielectric structure 108 both comprise the first dielectric. In some embodiments the first dielectric and/or the second dielectric may, for example, comprise silicon dioxide, silicon nitride, silicon carbide, aluminum oxide, hafnium oxide, some silicon-oxygen-carbon-hydrogen dielectric, or some other suitable material. In some embodiments, the first plurality of conductive features 110a and/or the second plurality of conductive features 110b may, for example, comprise copper, aluminum, ruthenium, molybdenum, tungsten, titanium, tantalum, cobalt, or some other suitable material. In some embodiments, the semiconductor die 102 may alternatively be referred to as integrated chips.

In some embodiments, the first plurality of conductive features 110a and/or the second plurality of conductive features 110b may be square-shaped, circular-shaped, octagon-shaped, or some other suitable shape when viewed from above. Although FIG. 2 illustrates the semiconductor die 102 as having nine conductive features 110b, it will be appreciated that the semiconductor die 102 may alternatively have another number (e.g., 2, 4, 16, 25, etc.) of conductive features 110b.

Figure 4:
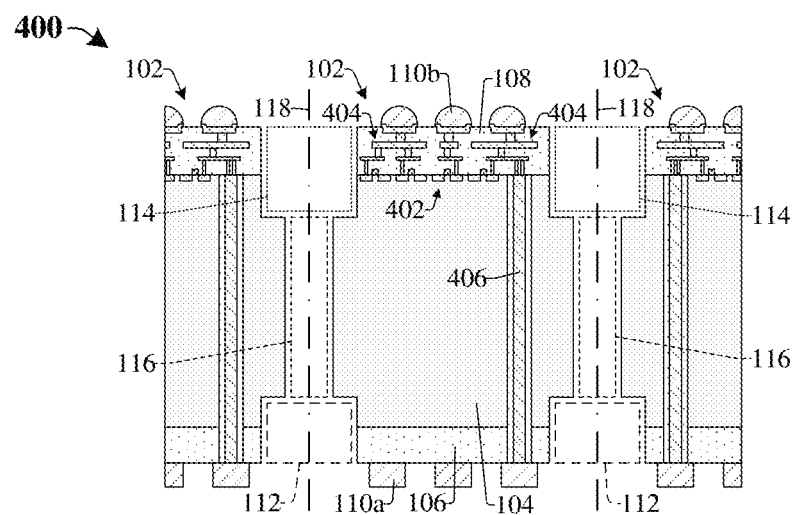
FIGS. 4-6 illustrate cross-sectional views of some embodiments of the semiconductor wafer structure of FIG. 1 in which the semiconductor die include a plurality of semiconductor devices, an interconnect structure, and a through-substrate via (TSV).

FIG. 4 illustrates a cross-sectional view 400 of some embodiments of the semiconductor wafer structure of FIG. 1 in which the semiconductor die 102 include a plurality of semiconductor devices 402, an interconnect structure 404, and a through-substrate via (TSV) 406.

The semiconductor devices 402 are arranged along the second side 104b of the substrate 104. The interconnect structure 404 is disposed within the second dielectric structure 108. The interconnect structure 404 includes a third plurality of conductive features (e.g., conductive lines, conductive vias, contacts, electrodes, bond pads, or the like). The semiconductor devices 402 are coupled to the interconnect structure 404 and the interconnect structure 404 is coupled to the second plurality of conductive features 110b.

The TSV 406 is coupled to the interconnect structure 404. The TSV 406 extends through the substrate 104 from the second side 104b of the substrate 104 to the first side 102a of the semiconductor wafer structure (e.g., to one or more of the first plurality of conductive features 110a). In some embodiments, a dielectric liner layer (not labeled) lines the TSV 406 and isolates the TSV from the substrate 104.

In some embodiments, the first plurality of conductive features 110a include bond pads and the second plurality of conductive features 110b include solder bumps, or vice versa. In some embodiments, depths of the second dicing cut regions 114 are greater than a depths of the semiconductor devices 402.

Figure 5:
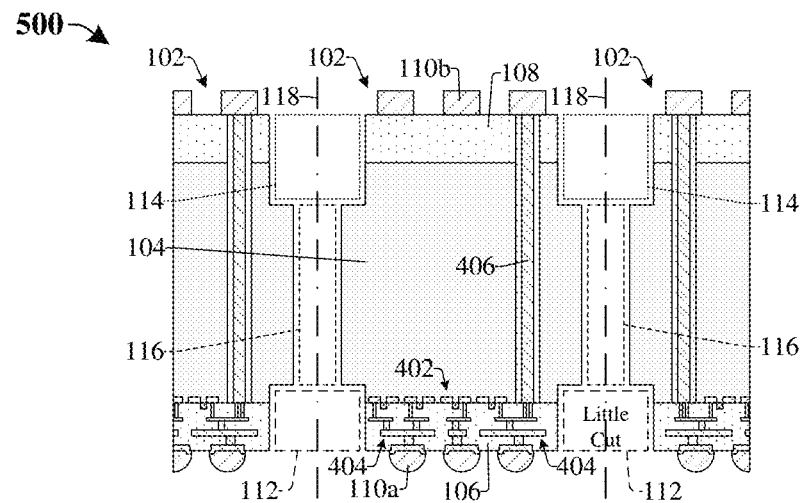

FIG. 5 illustrates a cross-sectional view 500 of some embodiments of the semiconductor wafer structure of FIG. 4 in which the semiconductor devices 402 are arranged along the first side 104a of the substrate 104.

The interconnect structure 404 is disposed within the first dielectric structure 106. The TSV 406 extends through the substrate 104 from the first side 104a of the substrate 104 to the second side 102b of the semiconductor wafer structure (e.g., to one or more of the second plurality of conductive features 110b). In some embodiments, depths of the first dicing cut regions 112 are greater than a depths of the semiconductor devices 402.

FIG. 6 illustrates a cross-sectional view 600 of some embodiments of the semiconductor wafer structure of FIG. 1 in which the semiconductor wafer structure includes a first wafer portion 601a and a second wafer portion 601b.

The first wafer portion 601a and the second wafer portion 601b each include the substrate 104, a plurality of semiconductor devices 402, an interconnect structure 404, a TSV 406, and third dielectric structures 602. The substrate 104 includes a first substrate portion (e.g., at the first wafer portion 601a) and a second substrate portion (e.g., at the second wafer portion 601b). The first substrate portion and the second substrate portion are separated by the third dielectric structures 602. The interconnect structures 404 are disposed within the third dielectric structures 602 and are coupled along an interface where the first wafer portion 601a meets the second wafer portion 601b. In some embodiments, the first wafer portion 601a and the second wafer portion 601b each include hybrid bonding features (e.g., one or more hybrid bonding dielectric layers and one or more hybrid bonding conductive bond pads or some other suitable hybrid bonding features) disposed along the interface where the first wafer portion 601a meets the second wafer portion 601b. In some embodiments, the hybrid bonding features are disposed between the interconnect structure 404 of the first wafer portion 601a and the interconnect structure 404 of the second wafer portion 601b. In some embodiments, the first wafer portion 601a and the second wafer portion 601b are bonded along the hybrid bonding features. The first wafer portion 601a includes the first dielectric structure 106 and the first plurality of conductive features 110a. The second wafer portion 601b includes the second dielectric structure 108 and the second plurality of conductive features 110b.

The first dicing cut regions 112 extend through the first dielectric structure 106 and into the substrate 104 to a depth that is less than a total thickness of the first substrate portion (e.g., the first dicing cut regions 112 do not extend into the third dielectric structure 602). The second dicing cut regions 114 extend through the second dielectric structure 108 and into the substrate 104 to a depth that is less than a total thickness of the second substrate portion (e.g., the second dicing cut regions 114 do not extend into the third dielectric structure 602). The third dicing cut regions 116 extend from the first dicing cut regions 112 to the second dicing cut regions 114 (e.g., from the first substrate portion, through the third dielectric structures 602, to the second substrate portion).

Figure 7:
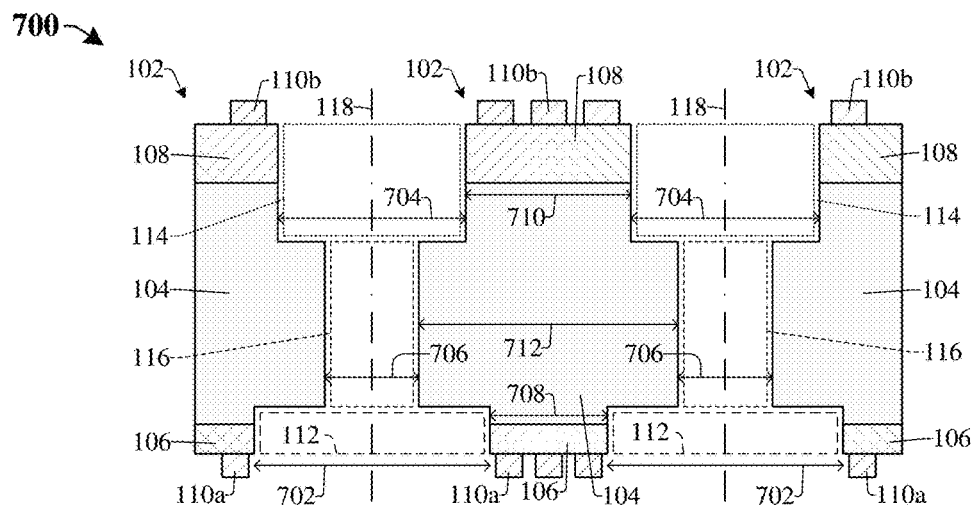
FIGS. 7-11 illustrate cross-sectional views of some embodiments of the semiconductor wafer structure of FIG. 1 in which widths of the first dicing cut regions vary.

FIG. 7 illustrates a cross-sectional view 700 of some embodiments of the semiconductor wafer structure of FIG. 1 in which widths 702 of the first dicing cut regions 112 are greater than widths 704 of the second dicing cut regions 114 and greater than widths 706 of the third dicing cut regions 116.

In some embodiments, the widths 702 of the first dicing cut regions 112 are greater than the widths 704 of the second dicing cut regions 114 and greater than the widths 706 of the third dicing cut regions 116 because a width of a first blade used for the first dicing cuts is greater than a width of a second blade used for the second dicing cuts and greater than a width of a third blade used for the third dicing cuts. Because the widths 702 of the first dicing cut regions 112 are greater than the widths 704 of the second dicing cut regions 114 and the widths 706 of the third dicing cut regions 116, a distance 708 between the first pair of opposing sidewalls (e.g., 104c of FIG. 1) of the substrate 104 is less than a distance 710 between the second pair of opposing sidewalls (e.g., 104d of FIG. 1) of the substrate 104 and less than a distance 712 between the third pair of opposing sidewalls (e.g., 104e of FIG. 1) of the substrate 104.

Figure 8:
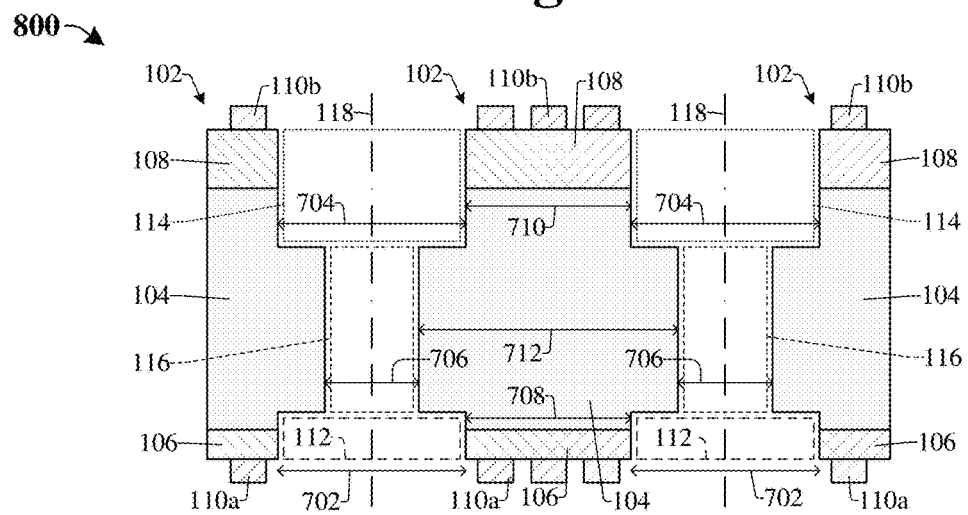

FIG. 8 illustrates a cross-sectional view 800 of some embodiments of the semiconductor wafer structure of FIG. 1 in which the widths 702 of the first dicing cut regions 112 are approximately equal to the widths 704 of the second dicing cut regions 114 and greater than the widths 706 of the third dicing cut regions 116.

In some embodiments, the widths 702 of the first dicing cut regions 112 are approximately equal to the widths 704 of the second dicing cut regions 114 and greater than the widths 706 of the third dicing cut regions 116 because the width of the first blade used for the first dicing cut is approximately equal to the width of the second blade used for the second dicing cuts and greater than the width of the third blade used for the third dicing cuts. Because the widths 702 of the first dicing cut regions 112 are approximately equal to the widths 704 of the second dicing cut regions 114 and greater than the widths 706 of the third dicing cut regions 116, the distance 708 between the first pair of opposing sidewalls (e.g., 104c of FIG. 1) of the substrate 104 is approximately equal to the distance 710 between the second pair of opposing sidewalls (e.g., 104d of FIG. 1) of the substrate 104 and less than the distance 712 between the third pair of opposing sidewalls (e.g., 104e of FIG. 1) of the substrate 104.

Figure 9:
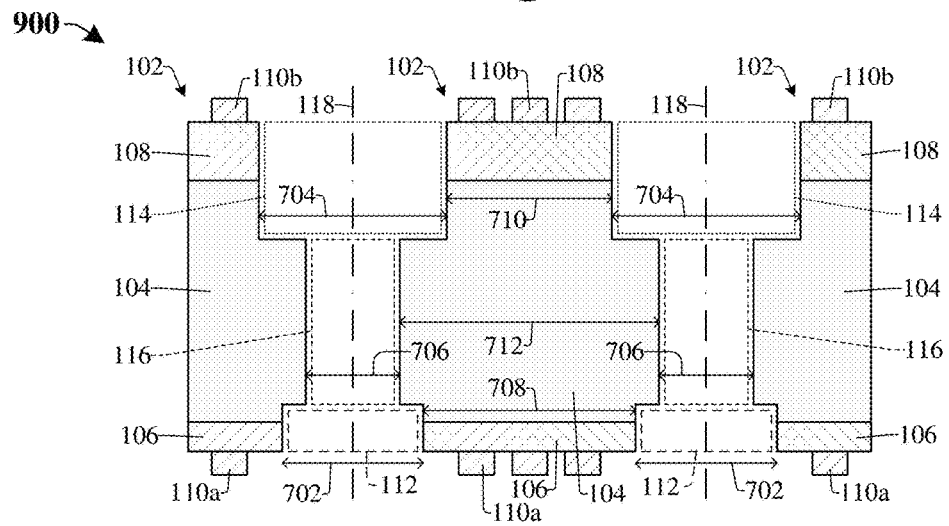

FIG. 9 illustrates a cross-sectional view 900 of some embodiments of the semiconductor wafer structure of FIG. 1 in which the widths 702 of the first dicing cut regions 112 are less than the widths 704 of the second dicing cut regions 114 and greater than the widths 706 of the third dicing cut regions 116.

In some embodiments, the widths 702 of the first dicing cut regions 112 are less than the widths 704 of the second dicing cut regions 114 and greater than the widths 706 of the third dicing cut regions 116 because the width of the first blade used for the first dicing cut is less than the width of the second blade used for the second dicing cuts and greater than the width of the third blade used for the third dicing cuts. Because the widths 702 of the first dicing cut regions 112 are less than the widths 704 of the second dicing cut regions 114 and greater than the widths 706 of the third dicing cut regions 116, the distance 708 between the first pair of opposing sidewalls (e.g., 104c of FIG. 1) of the substrate 104 is greater than the distance 710 between the second pair of opposing sidewalls (e.g., 104d of FIG. 1) of the substrate 104 and less than the distance 712 between the third pair of opposing sidewalls (e.g., 104e of FIG. 1) of the substrate 104.

Figure 10:
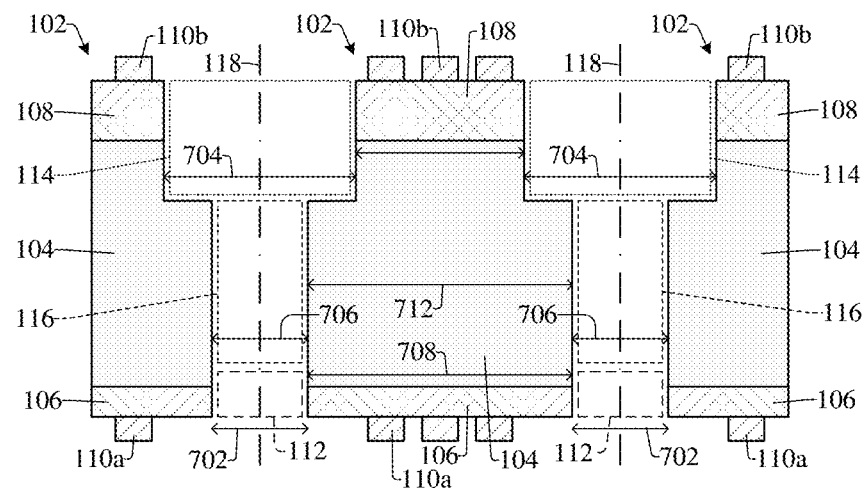

FIG. 10 illustrates a cross-sectional view 1000 of some embodiments of the semiconductor wafer structure of FIG. 1 in which the widths 702 of the first dicing cut regions 112 are less than the widths 704 of the second dicing cut regions 114 and approximately equal to the widths 706 of the third dicing cut regions 116.

In some embodiments, the widths 702 of the first dicing cut regions 112 are less than the widths 704 of the second dicing cut regions 114 and approximately equal to the widths 706 of the third dicing cut regions 116 because the width of the first blade used for the first dicing cut is less than the width of the second blade used for the second dicing cuts and approximately equal to the width of the third blade used for the third dicing cuts. Because the widths 702 of the first dicing cut regions 112 are less than the widths 704 of the second dicing cut regions 114 and approximately equal to the widths 706 of the third dicing cut regions 116, the distance 708 between the first pair of opposing sidewalls (e.g., 104c of FIG. 1) of the substrate 104 is greater than the distance 710 between the second pair of opposing sidewalls (e.g., 104d of FIG. 1) of the substrate 104 and approximately equal to the distance 712 between the third pair of opposing sidewalls (e.g., 104e of FIG. 1) of the substrate 104. In some such embodiments, the first pair of opposing sidewalls and the third pair of opposing sidewalls are a same pair of opposing sidewalls.

Figure 11:
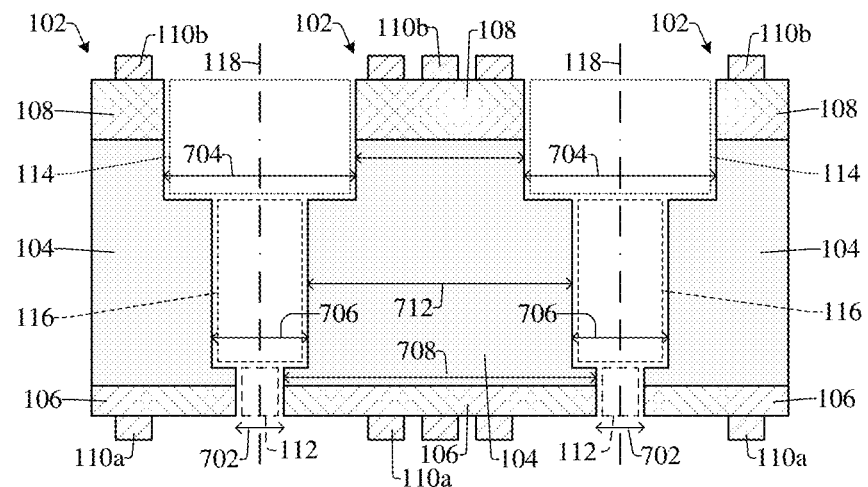

FIG. 11 illustrates a cross-sectional view 1100 of some embodiments of the semiconductor wafer structure of FIG. 1 in which the widths 702 of the first dicing cut regions 112 are less than the widths 704 of the second dicing cut regions 114 and less than the widths 706 of the third dicing cut regions 116.

In some embodiments, the widths 702 of the first dicing cut regions 112 are less than the widths 704 of the second dicing cut regions 114 and less than the widths 706 of the third dicing cut regions 116 because the width of the first blade used for the first dicing cut is less than the width of the second blade used for the second dicing cuts and less than the width of the third blade used for the third dicing cuts. Because the widths 702 of the first dicing cut regions 112 are less than the widths 704 of the second dicing cut regions 114 and less than the widths 706 of the third dicing cut regions 116, the distance 708 between the first pair of opposing sidewalls (e.g., 104c of FIG. 1) of the substrate 104 is greater than the distance 710 between the second pair of opposing sidewalls (e.g., 104d of FIG. 1) of the substrate 104 and greater than the distance 712 between the third pair of opposing sidewalls (e.g., 104e of FIG. 1) of the substrate 104.

Figure 12:
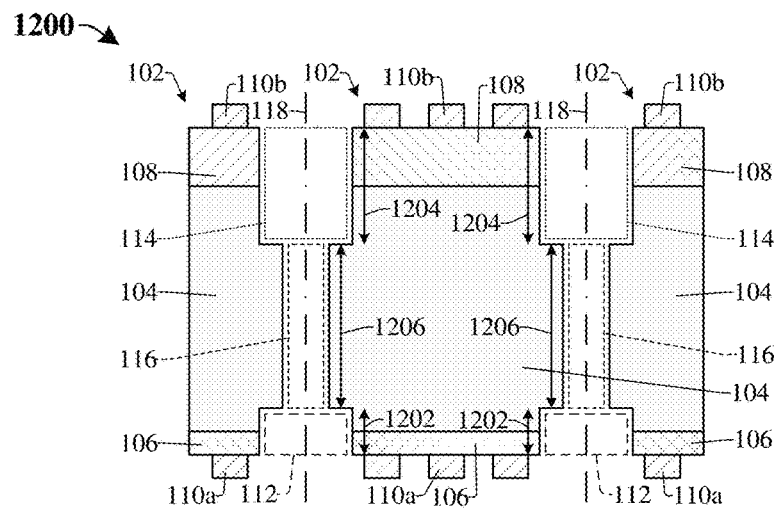
FIG. 12 illustrates a cross-sectional view of some embodiments of the semiconductor wafer structure of FIG. 1 in which depths of the first dicing cut regions are less than depths of the second dicing cut regions and less than depths of the third dicing cut regions.

FIG. 12 illustrates a cross-sectional view 1200 of some embodiments of the semiconductor wafer structure of FIG. 1 in which depths 1202 of the first dicing cut regions 112 are less than depths 1204 of the second dicing cut regions 114 and less than depths 1206 of the third dicing cut regions 116.

In some embodiments, the because the depths 1202 of the first dicing cut regions 112 are less than the depths 1204 of the second dicing cut regions 114 and less than the depths 1206 of the third dicing cut regions 116, a distance between a lower cut surface (e.g., 104f of FIG. 1) of the substrate 104 and a lowermost surface of the first dielectric structure 106 is less than a distance between an upper cut surface (e.g., 104g of FIG. 1) of the substrate 104 and an uppermost surface of the second dielectric structure 108 and less than a distance between the lower cut surface (e.g., 104f of FIG. 1) of the substrate 104 and the upper cut surface (e.g., 104g of FIG. 1) of the substrate 104.

In some other embodiments (not shown), the depths 1202 of the first dicing cut regions 112 are approximately equal to the depths 1204 of the second dicing cut regions 114 and less than the depths 1206 of the third dicing cut regions 116. In some other embodiments (not shown), the depths 1202 of the first dicing cut regions 112 are greater than the depths 1204 of the second dicing cut regions 114 and less than the depths 1206 of the third dicing cut regions 116.

Figure 13:
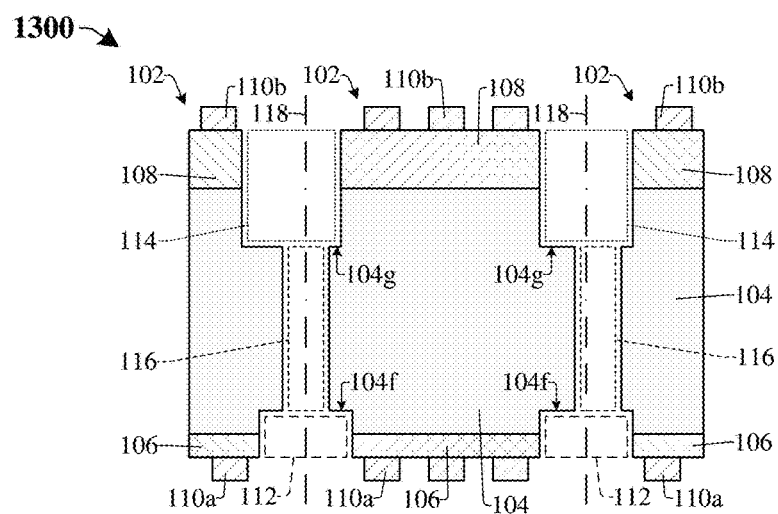
FIG. 13 illustrates a cross-sectional view of some embodiments of the semiconductor wafer structure of FIG. 1 in which the first dicing cut regions, the second dicing cut regions, and/or the third dicing cut regions are laterally offset from one another.

FIG. 13 illustrates a cross-sectional view 1300 of some embodiments of the semiconductor wafer structure of FIG. 1 in which the first dicing cut regions 112, the second dicing cut regions 114, and/or the third dicing cut regions 116 are laterally offset from one another along the scribe lines 118.

For example, the first dicing cut regions 112, the second dicing cut regions 114, and/or the third dicing cut regions 116 may not be symmetric about the scribe lines 118. Because the first dicing cut regions 112, the second dicing cut regions 114, and/or the third dicing cut regions 116 are laterally offset from one another, the lower cut surface 104f and/or the upper cut surface 104g of the substrate 104 may have a different width on one side (e.g., a left side) of the semiconductor die 102 than on the other side (e.g., a right side) of the semiconductor die 102.

Figure 14:
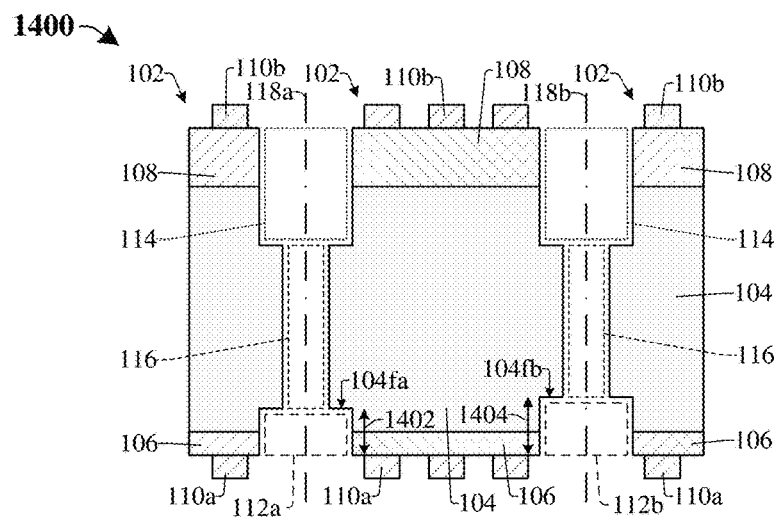
FIG. 14 illustrates a cross-sectional view of some embodiments of the semiconductor wafer structure of FIG. 1 in which depths of the first dicing cut regions vary from one another.

FIG. 14 illustrates a cross-sectional view 1400 of some embodiments of the semiconductor wafer structure of FIG. 1 in which depths 1202 of the first dicing cut regions 112 vary at different scribe lines.

For example, a depth 1402 of a first dicing cut region 112a along a first scribe line 118a that extends along a first direction is different from a depth 1404 of a first dicing cut region 112b along a second scribe line 118b that extends along the first direction. Thus, the substrate 104 may include a first lower cut surface 104fa and a second lower cut surface 104fb different from the first lower cut surface 104fa. The lower cut surfaces 104fa, 104fb are disposed at different heights. For example, the first lower cut surface 104fa is disposed below the second lower cut surface 104fb. In some embodiments, the depths (not labeled) of the second dicing cut regions 114 and/or the depths (not labeled) of the third dicing cut regions 116 may also vary at different scribe lines 118.

Figure 15:
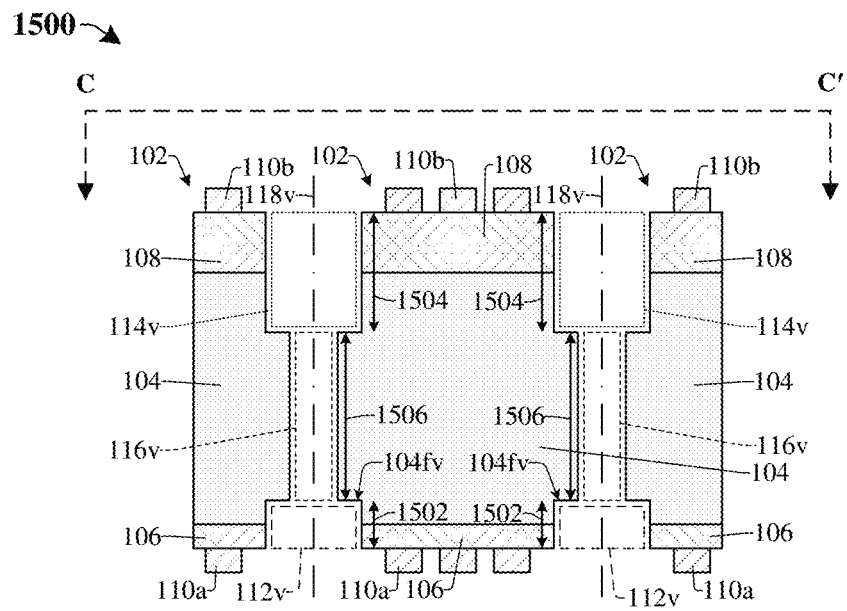
FIGS. 15 and 16 illustrate cross-sectional views of some embodiments of the semiconductor wafer structure of FIG. 1 in which depths of first dicing cuts along first scribe lines are different than depths of first dicing cut along second scribe lines.
Figure 16:
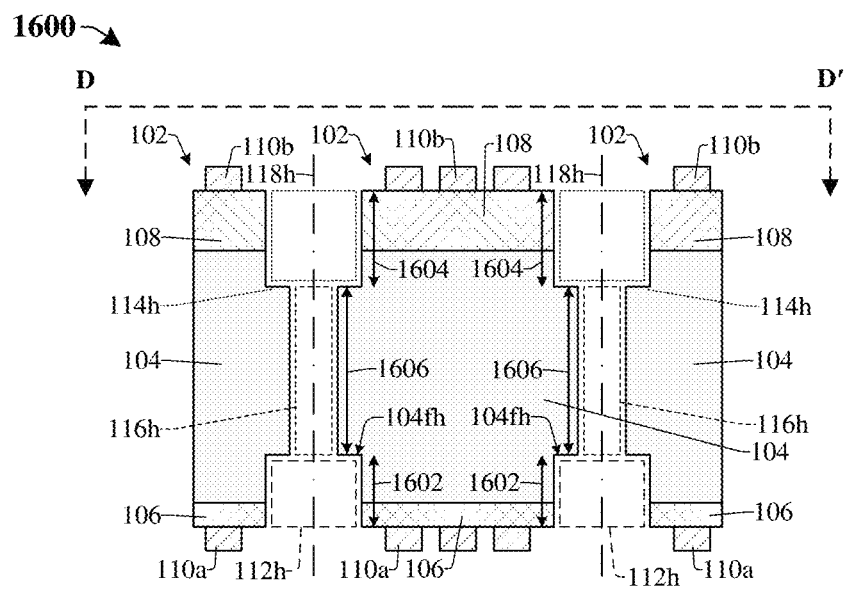
Figure 17:
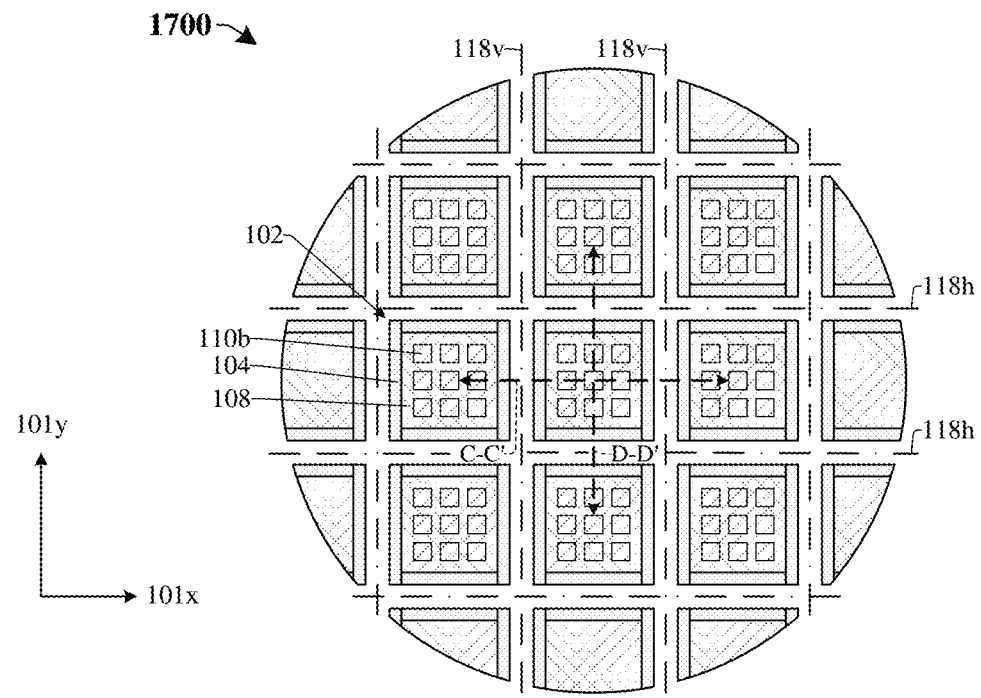
FIG. 17 illustrates a top view of some embodiments of the semiconductor wafer structure of FIGS. 15 and 16.
Figure 18:
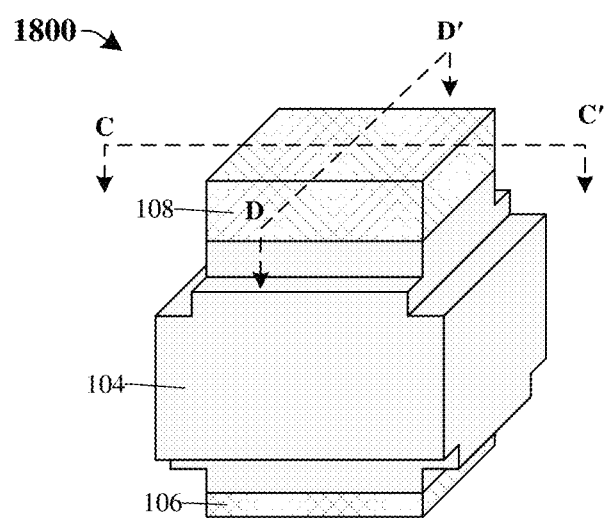
FIG. 18 illustrates a three-dimensional view of some embodiments of the semiconductor wafer structure of FIGS. 15 and 16.

FIG. 15 and FIG. 16 illustrate cross-sectional views 1500, 1600 of some embodiments of the semiconductor wafer structure of FIG. 1 in which depths 1502 of first dicing cuts along first scribe lines 118v are different than depths 1602 of first dicing cut along second scribe lines 118h. FIG. 17 illustrates a top view 1700 of some embodiments of the semiconductor wafer structure of FIGS. 15 and 16. In some embodiments, the cross-sectional view 1500 illustrated in FIG. 15 may, for example, be taken across line C-C' of FIG. 17, and the cross-sectional view 1600 illustrated in FIG. 16 may, for example, be taken across line D-D' of FIG. 17. FIG. 18 illustrates a three-dimensional view 1800 of some embodiments of the semiconductor wafer structure of FIGS. 15 and 16.

Referring to FIGS. 15-18, first scribe lines 118v extend along a first direction 101y (e.g., a vertical direction when viewed from above) and second scribe lines 118h extend along a second direction 101x (e.g., a horizontal direction when viewed from above). A first plurality of first dicing cut regions 112v extend along the first scribe lines 118v. A second plurality of first dicing cut regions 112h extend along the second scribe lines 118h. In some embodiments, depths 1502 of the first plurality of first dicing cut regions 112v are different than depths 1602 of the second plurality of first dicing cut regions 112h. For example, as illustrated in FIGS. 15-18, the depths 1502 of the first plurality of first dicing cut regions 112v are less than the depths 1602 of the second plurality of first dicing cut regions 112h. In some other embodiments, the depths 1502 of the first plurality of first dicing cut regions 112v are greater than the depths 1602 of the second plurality of first dicing cut regions 112h.

Because the depths 1502 of the first plurality of first dicing cut regions 112v are different from the depths 1602 of the second plurality of first dicing cut regions 112h, the substrate 104 has first lower cut surfaces 104fv on first opposing sides of the semiconductor die 102 and second lower cut surfaces 104fh on second opposing sides of the semiconductor die 102, where the second lower cut surfaces 104fh are disposed at a different height than the first lower cut surfaces 104fv (e.g., the second lower cut surfaces 104fh are above or below the first lower cut surfaces 104fv).

Further, in some embodiments, depths 1504 of a first plurality of second dicing cut regions 114v are different than depths 1604 of a second plurality of second dicing cut regions 114h. Furthermore, in some embodiments, depths 1506 of a first plurality of third dicing cut regions 116v are different than depths 1606 of a second plurality of third dicing cut regions 116h.

FIGS. 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, and 26C (i.e., FIGS. 19A-26C) illustrate cross-sectional views 1900a, 1900b, 2000a, 2000b, 2100a, 2100b, 2200a, 2200b, 2300a, 2300b, 2400a, 2400b, 2500a, 2500b, 2600a, and 2600b, and top views 1900c, 2000c, 2100c, 2200c, 2300c, 2400c, 2500c, and 2600c of some embodiments of a method for dicing a semiconductor wafer structure. Although FIGS. 19A-26C are described in relation to a method, it will be appreciated that the structures disclosed in FIGS. 19A-26C are not limited to such a method, but instead may stand alone as structures independent of the method.

Figure 19A:
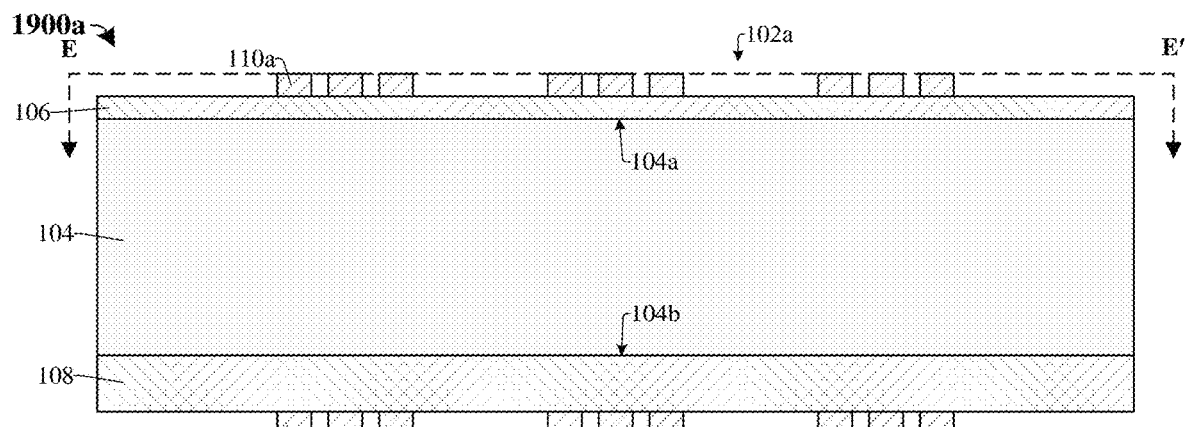
FIGS. 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, and 26C illustrate cross-sectional views and top views of some embodiments of a method for dicing a semiconductor wafer structure.
Figure 19B:
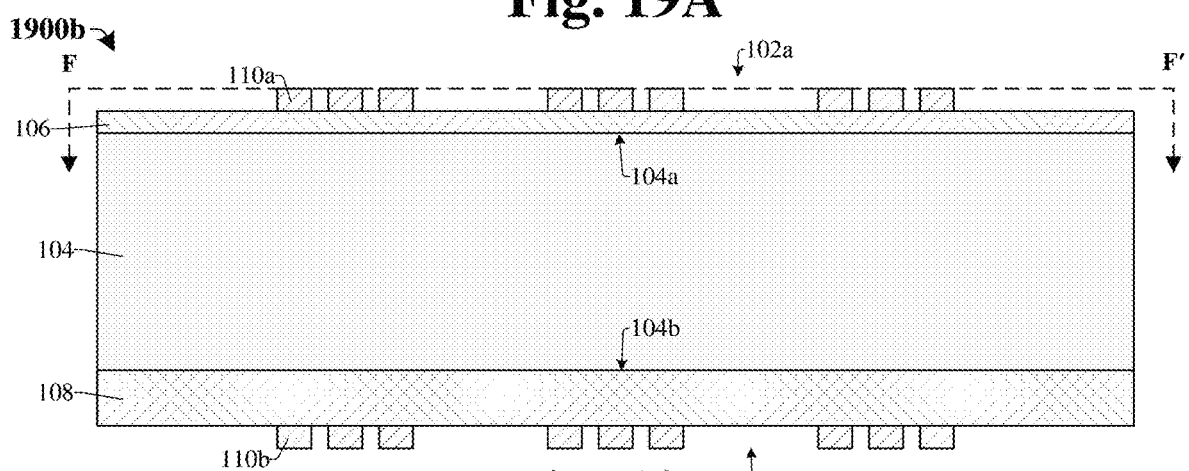
Figure 19C:
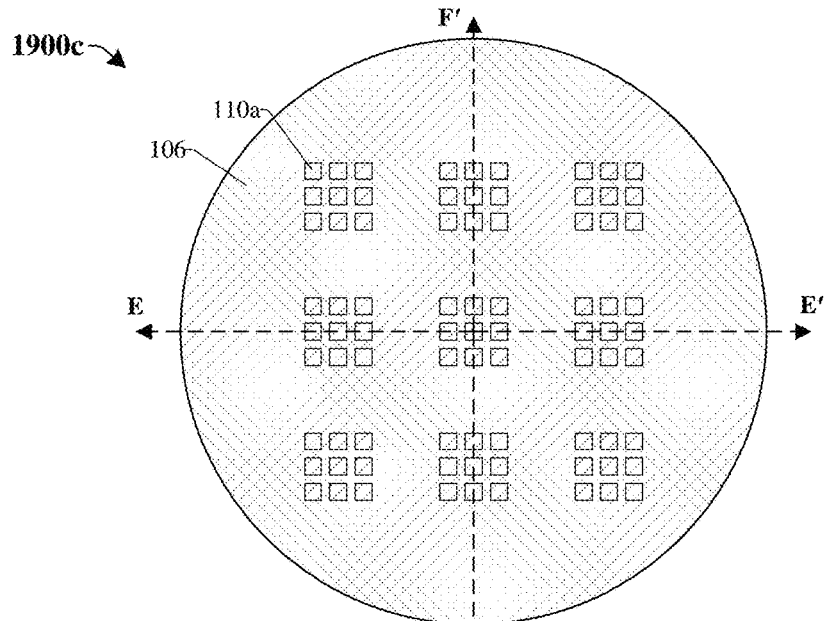

As shown in cross-sectional view 1900a of FIG. 19A, cross-sectional view 1900b of FIG. 19B, and top view 1900c of FIG. 19C, a semiconductor wafer structure is provided. The semiconductor wafer structure includes a semiconductor substrate 104, a first dielectric structure 106 on a first side 104a of the substrate 104, and a second dielectric structure 108 on a second side 104b of the substrate 104. Further, a first plurality of conductive features 110a are on the first dielectric structure 106 and a second plurality of conductive features 110b are on the second dielectric structure 108. The semiconductor wafer structure may be arranged on a dicing frame (not shown) and may be attached to the dicing frame by an adhesive layer (not shown).

In some embodiments, the cross-sectional view 1900a illustrated in FIG. 19A may, for example, be taken across line E-E' of FIG. 19C, and the cross-sectional view 1900b illustrated in FIG. 19B may, for example, be taken across line F-F' of FIG. 19C.

Figure 20A:
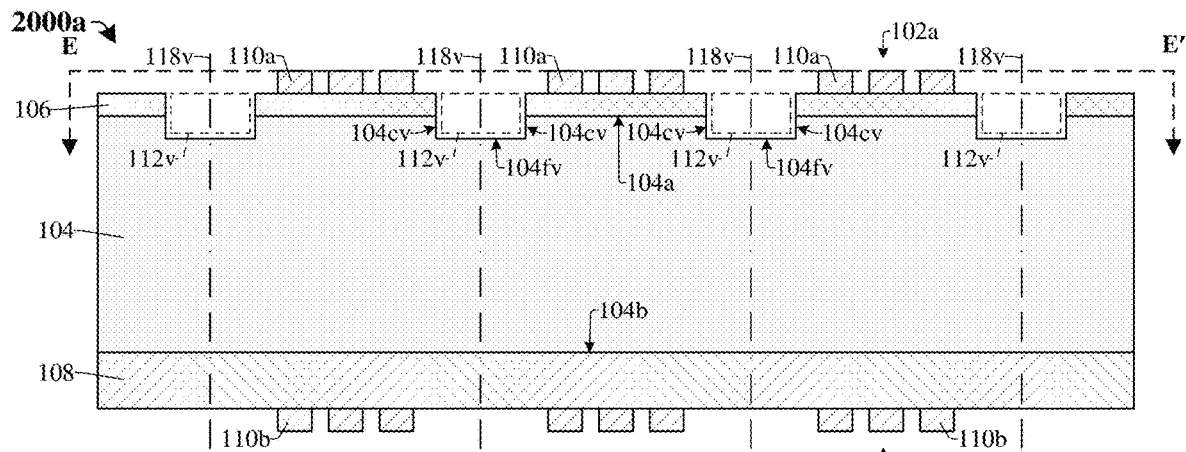
Figure 20B:
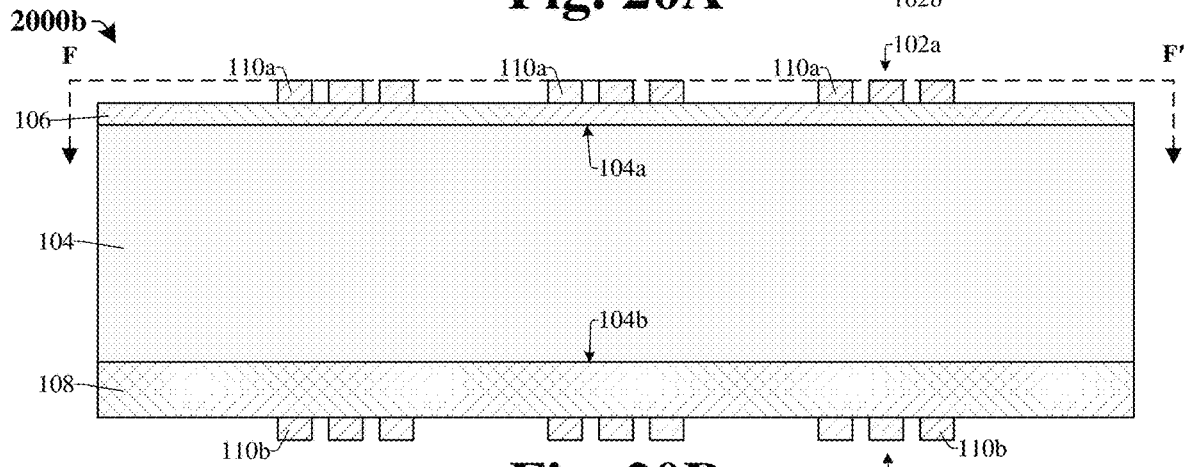
Figure 20C:
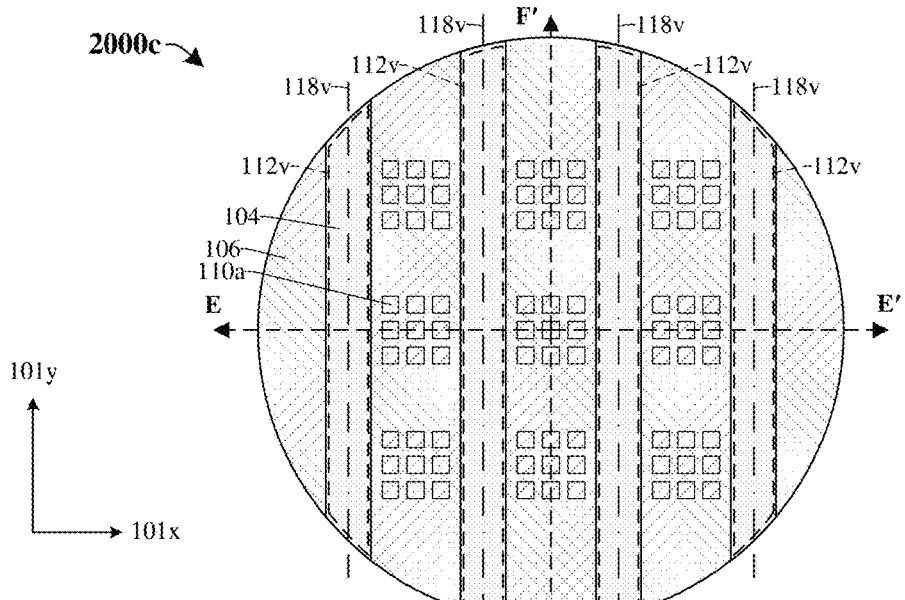

As shown in cross-sectional view 2000a of FIG. 20A, cross-sectional view 2000b of FIG. 20B, and top view 2000c of FIG. 20C, a first plurality of first dicing cuts are performed along first scribe lines 118v which extend along a first direction 101y (e.g., a vertical direction when viewed from above). The first plurality of first dicing cuts extend through the first dielectric structure 106 and into the first side 104a of the substrate 104. The first plurality of first dicing cuts extend into the substrate 104 to a depth that is less than the total depth of the substrate 104 (e.g., the first plurality of first dicing cuts extend into the substrate 104 but not through the total thickness of the substrate 104). The first plurality of first dicing cuts form first pairs of first opposing sidewalls 104cv and first lower cut surfaces 104fv that delimit, at least in part, a first plurality of first dicing cut regions 112v (e.g., a first plurality of first recesses).

Figure 21A:
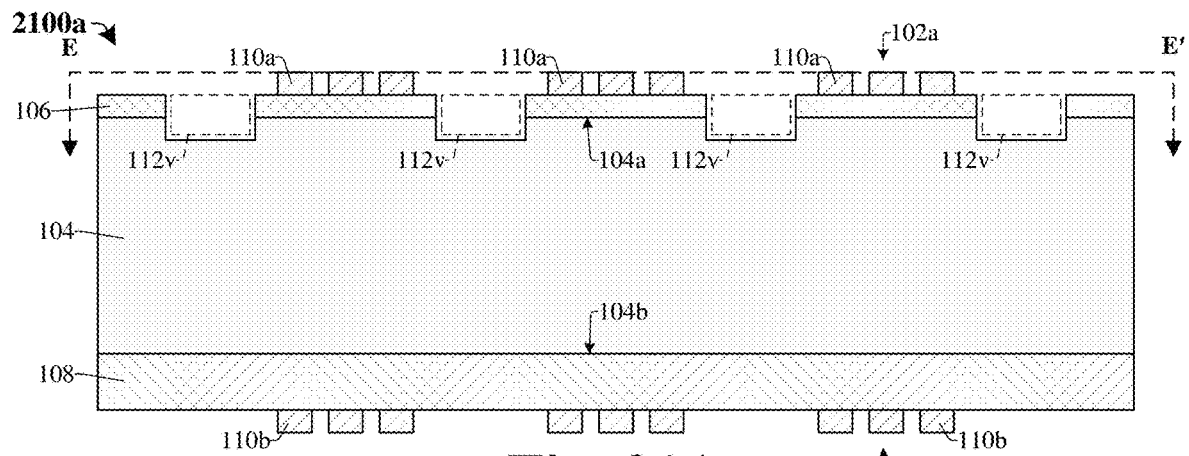
Figure 21B:
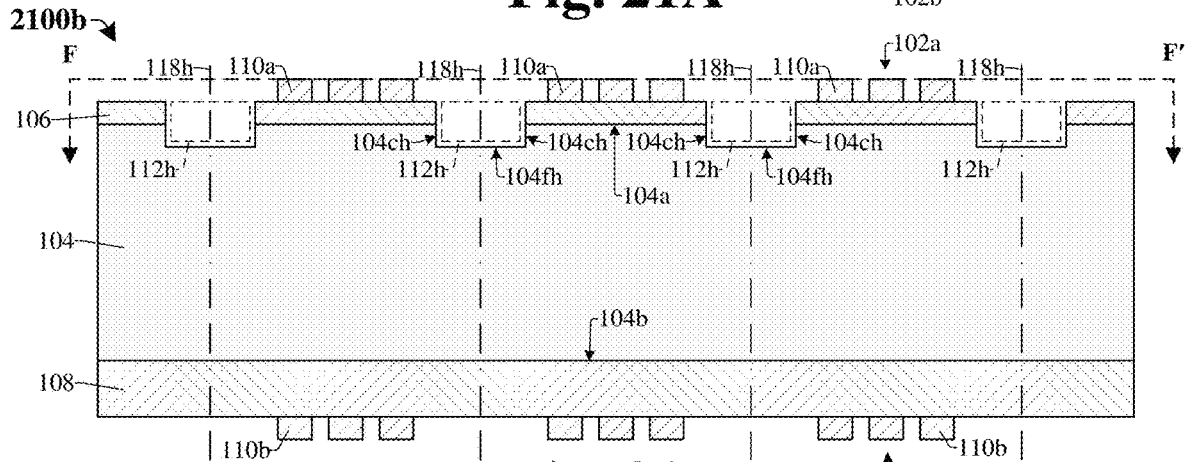
Figure 21C:
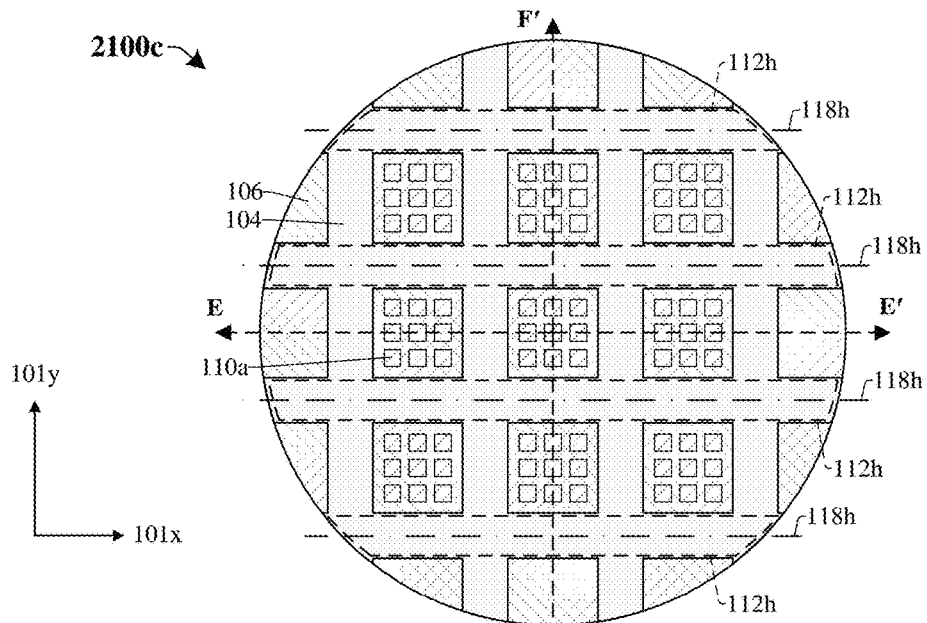

As shown in cross-sectional view 2100a of FIG. 21A, cross-sectional view 2100b of FIG. 21B, and top view 2100c of FIG. 21C, a second plurality of first dicing cuts are performed along second scribe lines 118h which extend along a second direction 101x (e.g., a horizontal direction when viewed from above). The second plurality of first dicing cuts extend through the first dielectric structure 106 and into the first side 104a of the substrate 104. The second plurality of first dicing cuts extend into the substrate 104 to a depth that is less than the total depth of the substrate 104 (e.g., the second plurality of first dicing cuts extend into the substrate 104 but not through the total thickness of the substrate 104). The second plurality of first dicing cuts form second pairs of first opposing sidewalls 104ch and second lower cut surfaces 104fh that delimit, at least in part, a second plurality of first dicing cut regions 112h (e.g., a second plurality of first recesses).

In some embodiments, performing the first dicing cuts comprises bringing a first dicing blade having a first width into contact with the semiconductor wafer structure.

In some embodiments, depths of the first plurality of first dicing cuts may be approximately the same as depths of the second plurality of first dicing cuts (e.g., as illustrated in FIGS. 1-3). In some other embodiments, depths of the first plurality of first dicing cuts may be different than depths of the second plurality of first dicing cuts (e.g., as illustrated in FIGS. 15-18).

Figure 22A:
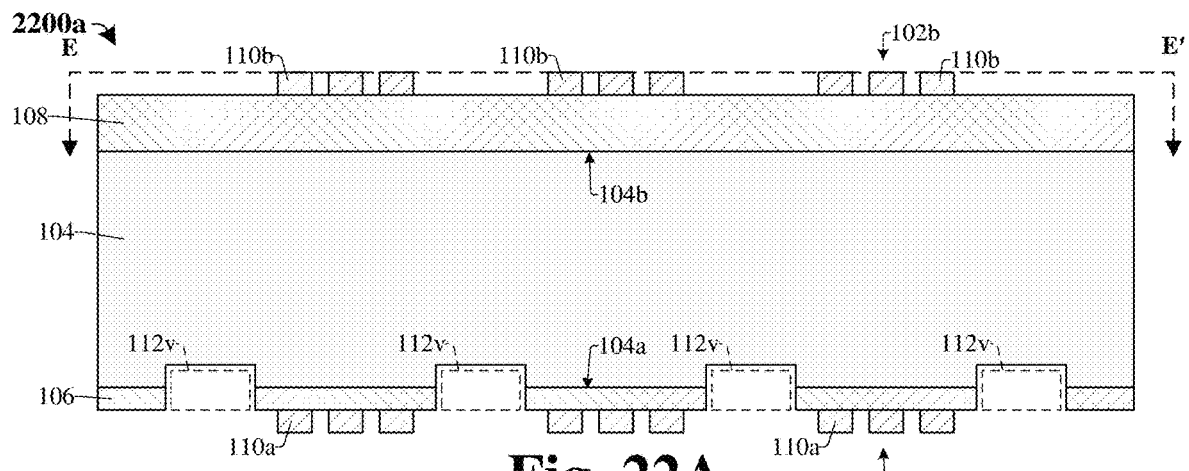
Figure 22B:
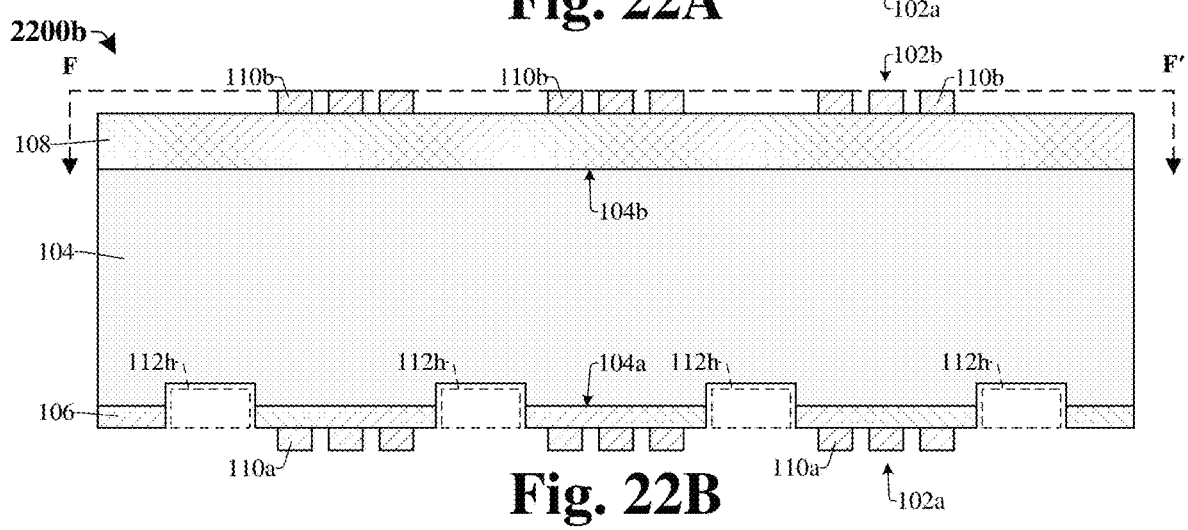
Figure 22C:
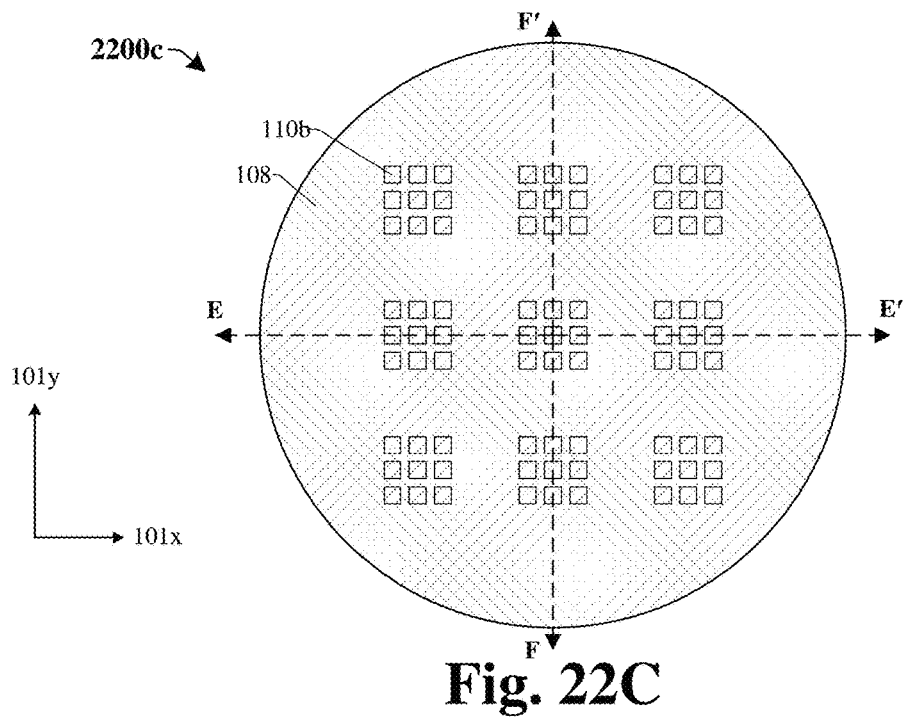

As shown in cross-sectional view 2200a of FIG. 22A, cross-sectional view 2200b of FIG. 22B, and top view 2200c of FIG. 22C, the wafer structure is inverted such that the second dielectric structure 108 is over the first dielectric structure 106.

Figure 23A:
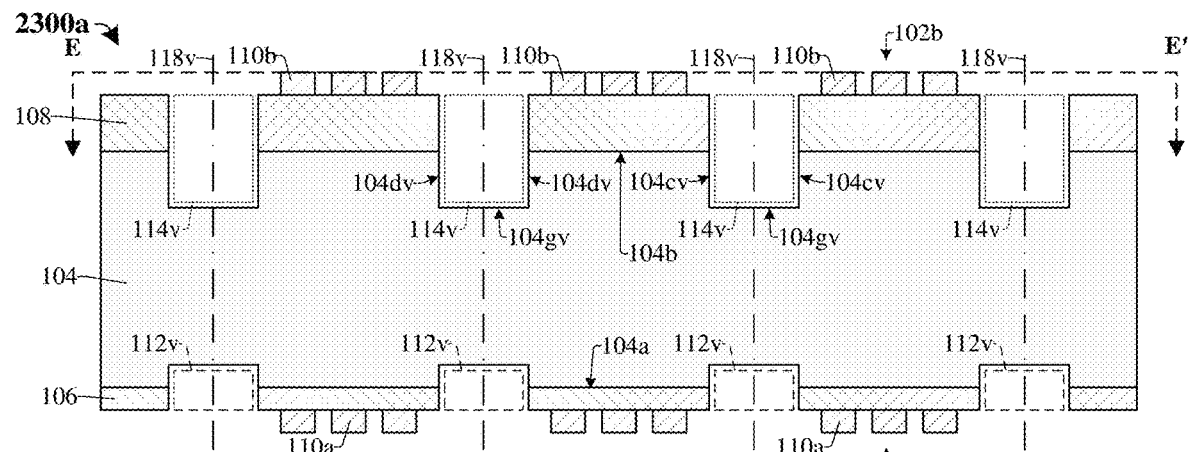
Figure 23B:
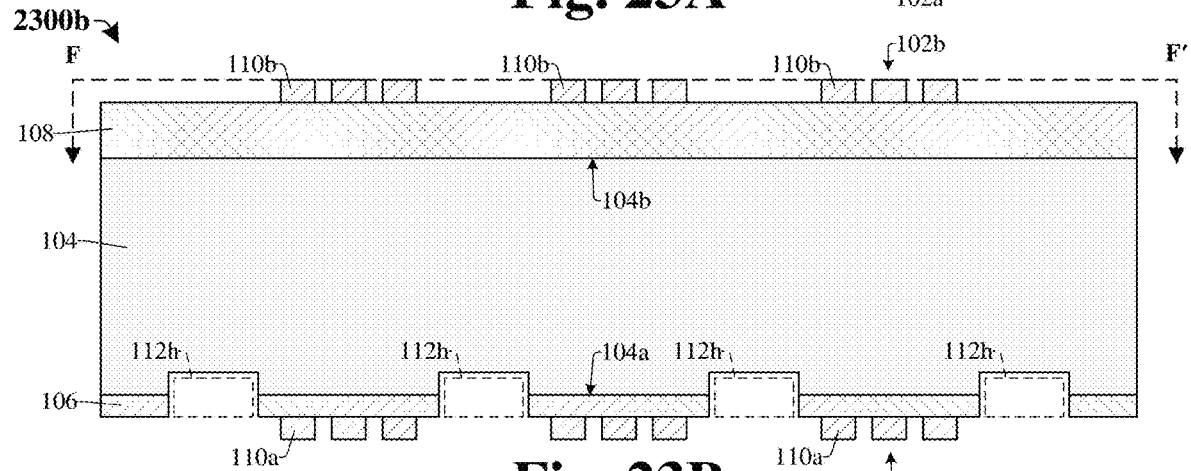
Figure 23C:
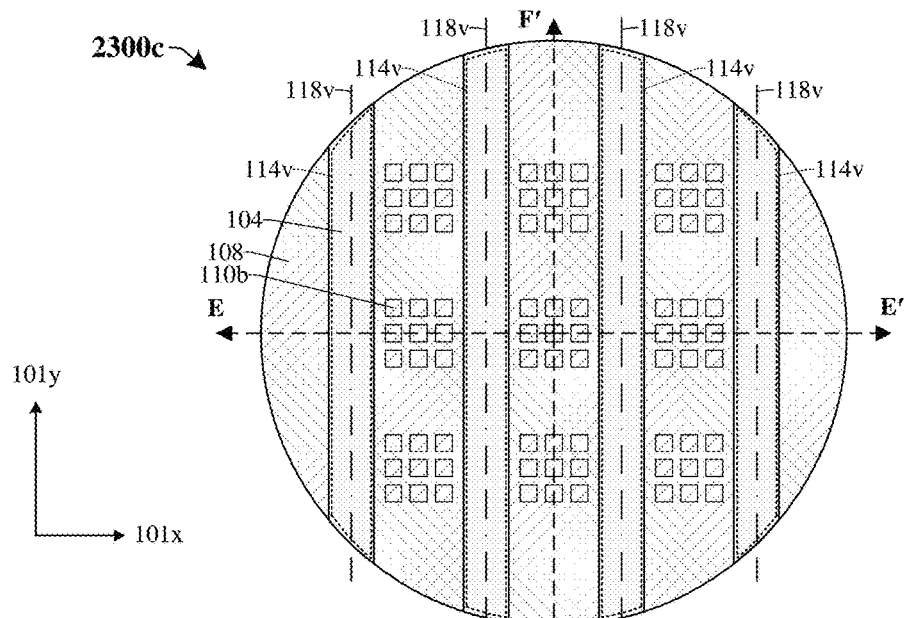

As shown in cross-sectional view 2300a of FIG. 23A, cross-sectional view 2300b of FIG. 23B, and top view 2300c of FIG. 23C, a first plurality of second dicing cuts are performed along the first scribe lines 118v. The first plurality of second dicing cuts extend through the second dielectric structure 108 and into the second side 104b of the substrate 104. The first plurality of second dicing cuts extend into the substrate 104 to a depth that is less than the total depth of the substrate 104. The first plurality of second dicing cuts form first pairs of second opposing sidewalls 104dv and first upper cut surfaces 104gv that delimit, at least in part, a first plurality of first dicing cut regions 114v (e.g., a first plurality of second recesses).

Figure 24A:
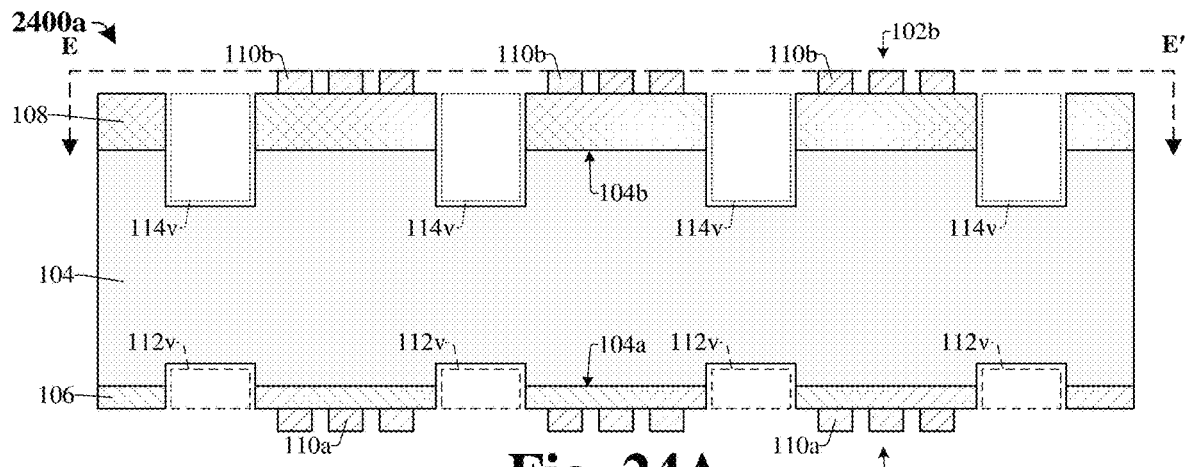
Figure 24B:
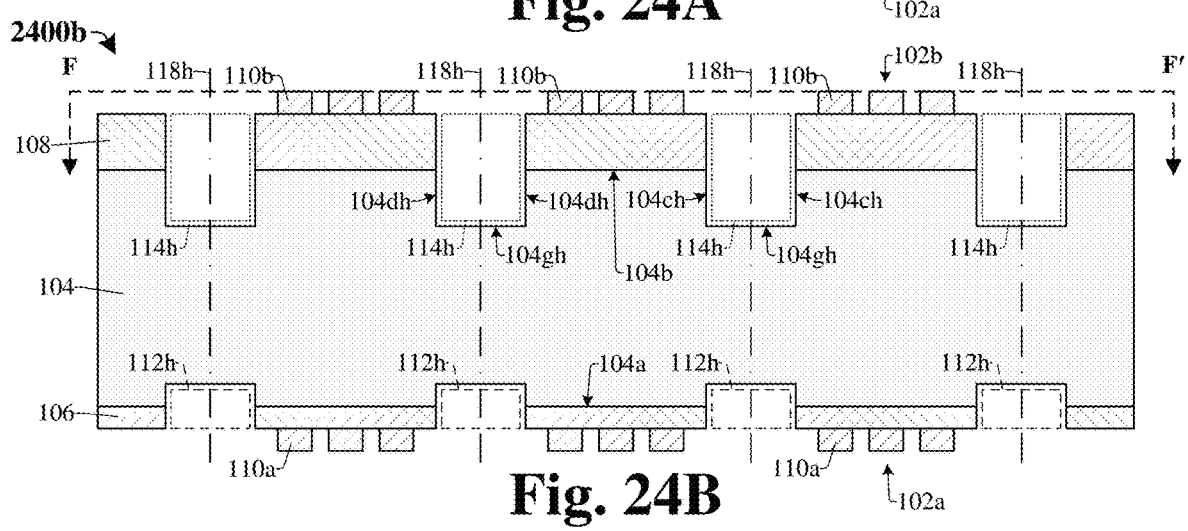
Figure 24C:
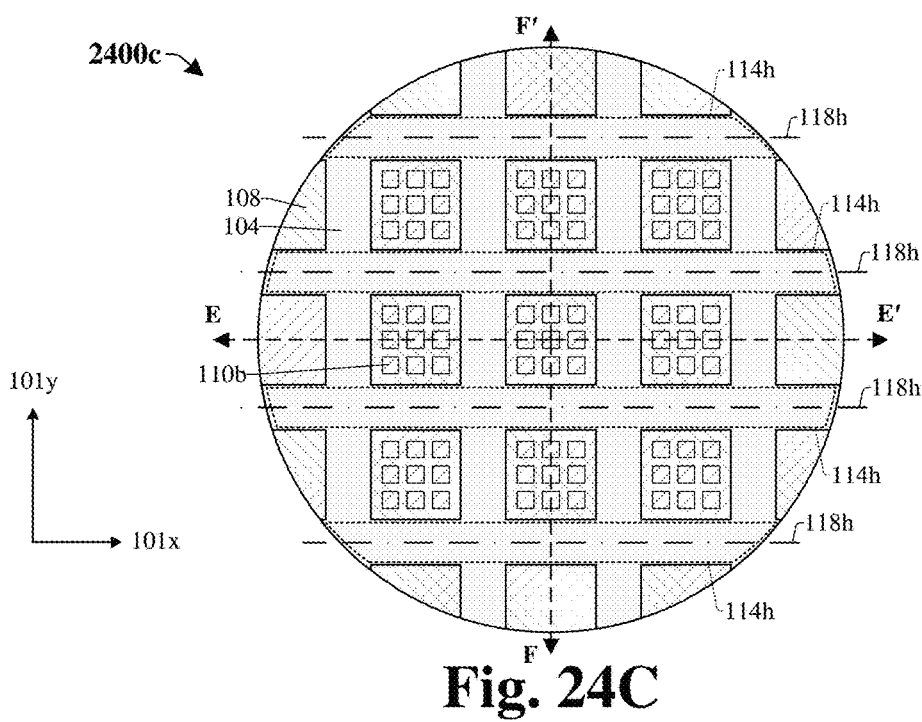

As shown in cross-sectional view 2400a of FIG. 24A, cross-sectional view 2400b of FIG. 24B, and top view 2400c of FIG. 24C, a second plurality of second dicing cuts are performed along the second scribe lines 118h. The second plurality of second dicing cuts extend through the second dielectric structure 108 and into the second side 104b of the substrate 104. The second plurality of second dicing cuts extend into the substrate 104 to a depth that is less than the total depth of the substrate 104. The second plurality of second dicing cuts form second pairs of second opposing sidewalls 104dh and second upper cut surfaces 104gh that delimit, at least in part, a second plurality of first dicing cut regions 114h (e.g., a second plurality of second recesses).

In some embodiments, performing the second dicing cuts comprises bringing a second dicing blade having a second width into contact with the semiconductor wafer structure. In some embodiments, the second blade is different from the first blade. For example, in some embodiments, the second width is different from the first width. In some other embodiments, the second width is approximately equal to the first width.

Figure 25A:
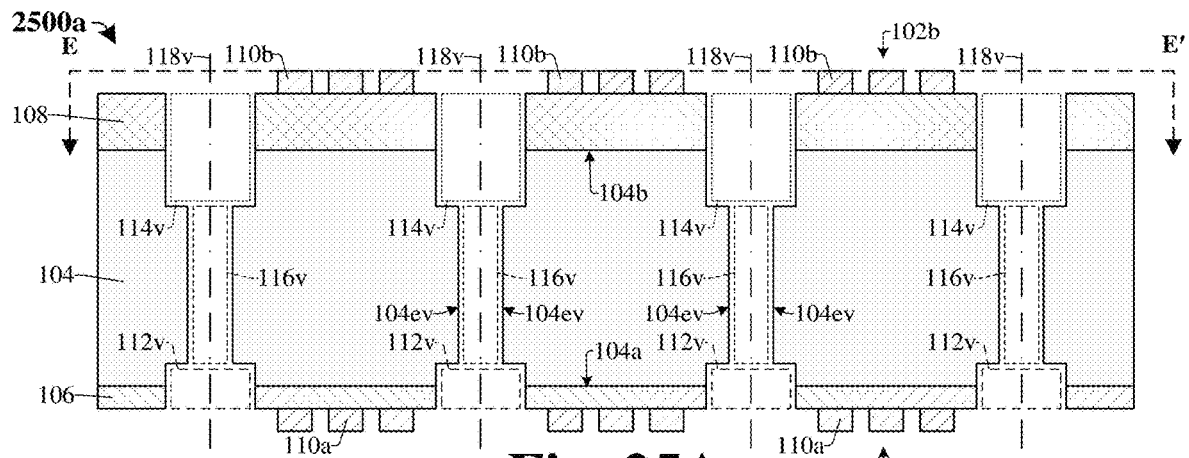
Figure 25B:
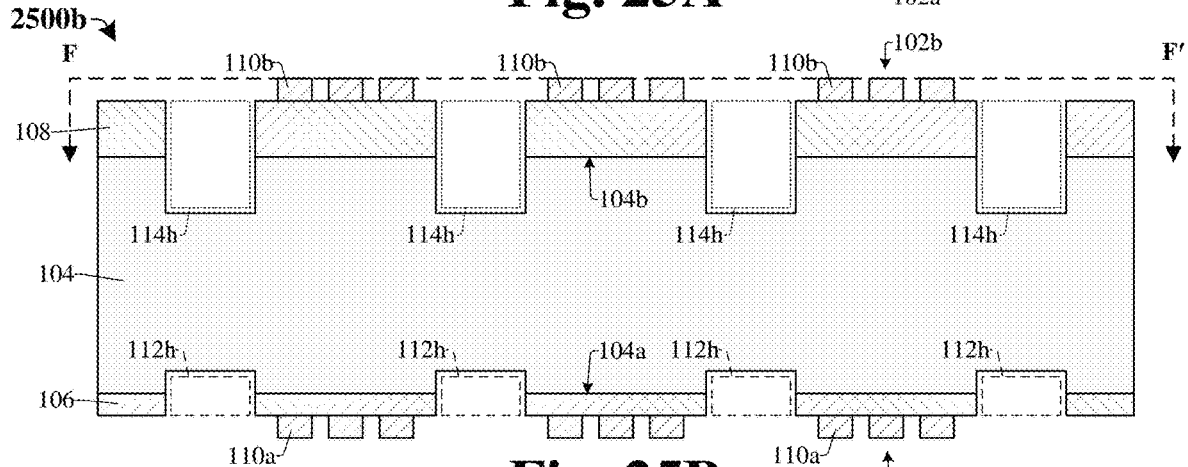
Figure 25C:
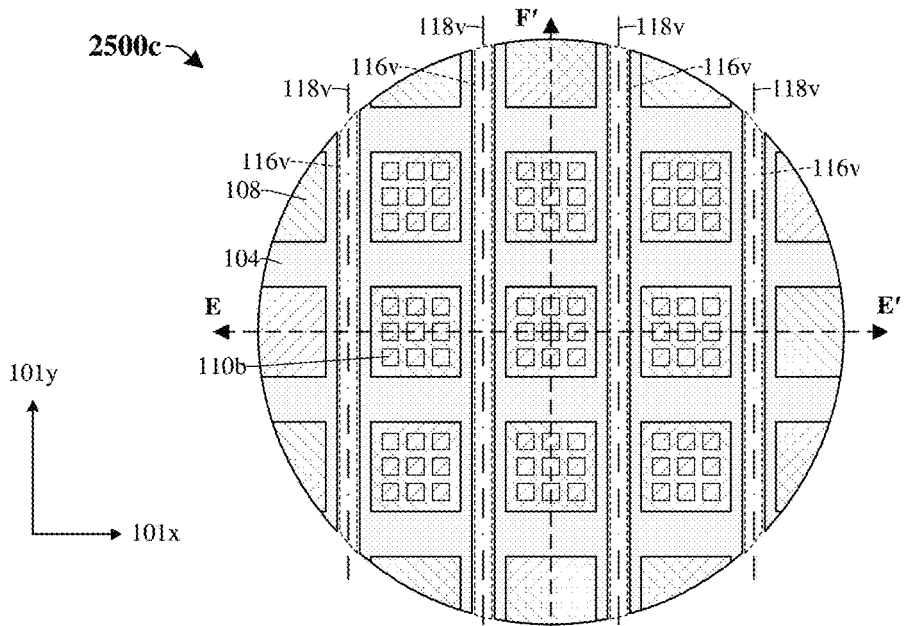

As shown in cross-sectional view 2500a of FIG. 25A, cross-sectional view 2500b of FIG. 25B, and top view 2500c of FIG. 25C, a first plurality of third dicing cuts are performed along the first scribe lines 118v. The first plurality of third dicing cuts extend through the substrate 104 from the first plurality of second dicing cut regions 114v to the first plurality of first dicing cut regions 112v. In other words, the first plurality of third dicing cuts extend through a remainder of the substrate 104 from the second side 104b of the substrate 104 to the first side 104a. The first plurality of third dicing cuts form first pairs of third opposing sidewalls 104ev that delimit, at least in part, a first plurality of third dicing cut regions 116v (e.g., a first plurality of third recesses). The first pairs of third opposing sidewalls 104ev extend between the first plurality of second dicing cut regions 114v and the first plurality of first dicing cut regions 112v.

Figure 26A:
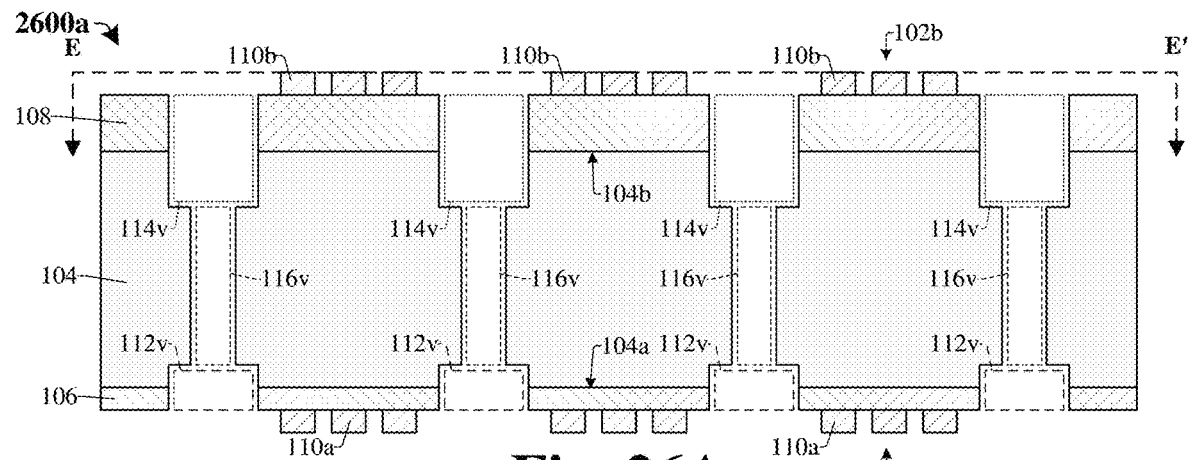
Figure 26B:
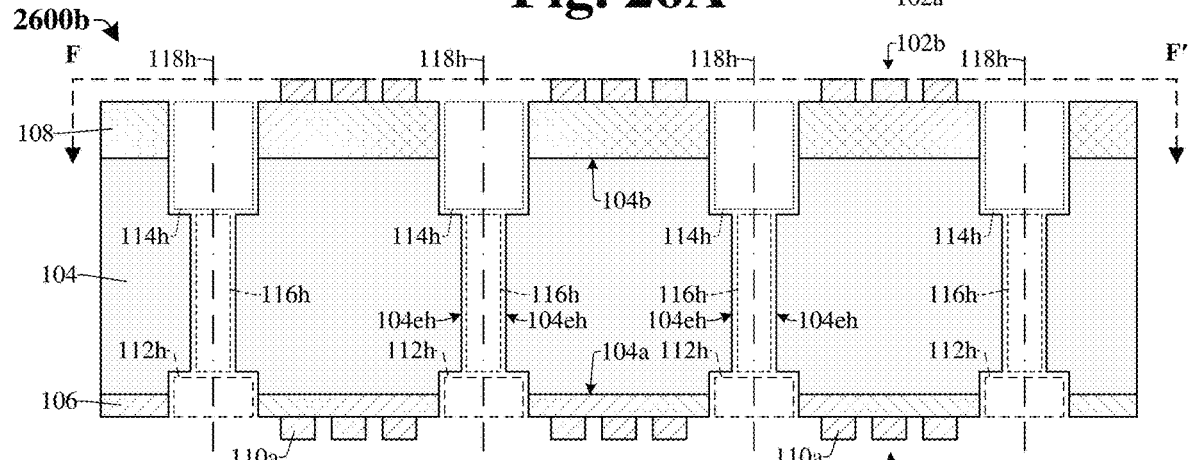
Figure 26C:
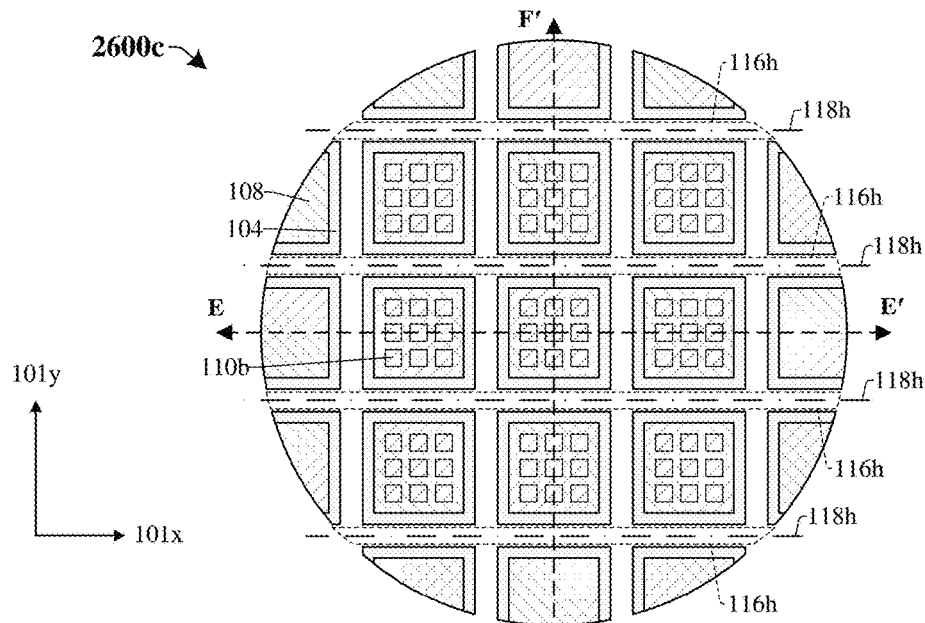

As shown in cross-sectional view 2600a of FIG. 26A, cross-sectional view 2600b of FIG. 26B, and top view 2600c of FIG. 26C, a second plurality of third dicing cuts are performed along the second scribe lines 118h. The second plurality of third dicing cuts extend through the substrate 104 from the second plurality of second dicing cut regions 114h to the second plurality of first dicing cut regions 112h. In other words, the second plurality of third dicing cuts extend through a remainder of the substrate 104 from the second side 104b of the substrate 104 to the first side 104a. The second plurality of third dicing cuts form second pairs of third opposing sidewalls 104eh that delimit, at least in part, a second plurality of third dicing cut regions 116h (e.g., a second plurality of third recesses). The second pairs of third opposing sidewalls 104eh extend between the second plurality of second dicing cut regions 114h and the second plurality of first dicing cut regions 112h.

In some embodiments, performing the third dicing cuts comprises bringing a third dicing blade having a third width into contact with the semiconductor wafer structure. In some embodiments, the third blade is different from the first blade and/or the second blade. For example, the third width is different from the first width and/or the second width.

By performing the first dicing cuts into the first side 104a of the substrate 104 before performing the third dicing cuts through the substrate 104 from the second side 104b to the first side 104a, the final cut interface (e.g., 120 of FIG. 1) is at the substrate 104 instead of at the first dielectric structure 106. Thus, a likelihood of the semiconductor die 102 being damaged (e.g., chipping) during dicing may be reduced because the substrate 104 is less prone to being damaged during dicing than is the first dielectric structure 106. As a result, a yield of reliable semiconductor die 102 from the semiconductor wafer structure may be improved.

Figure 27:
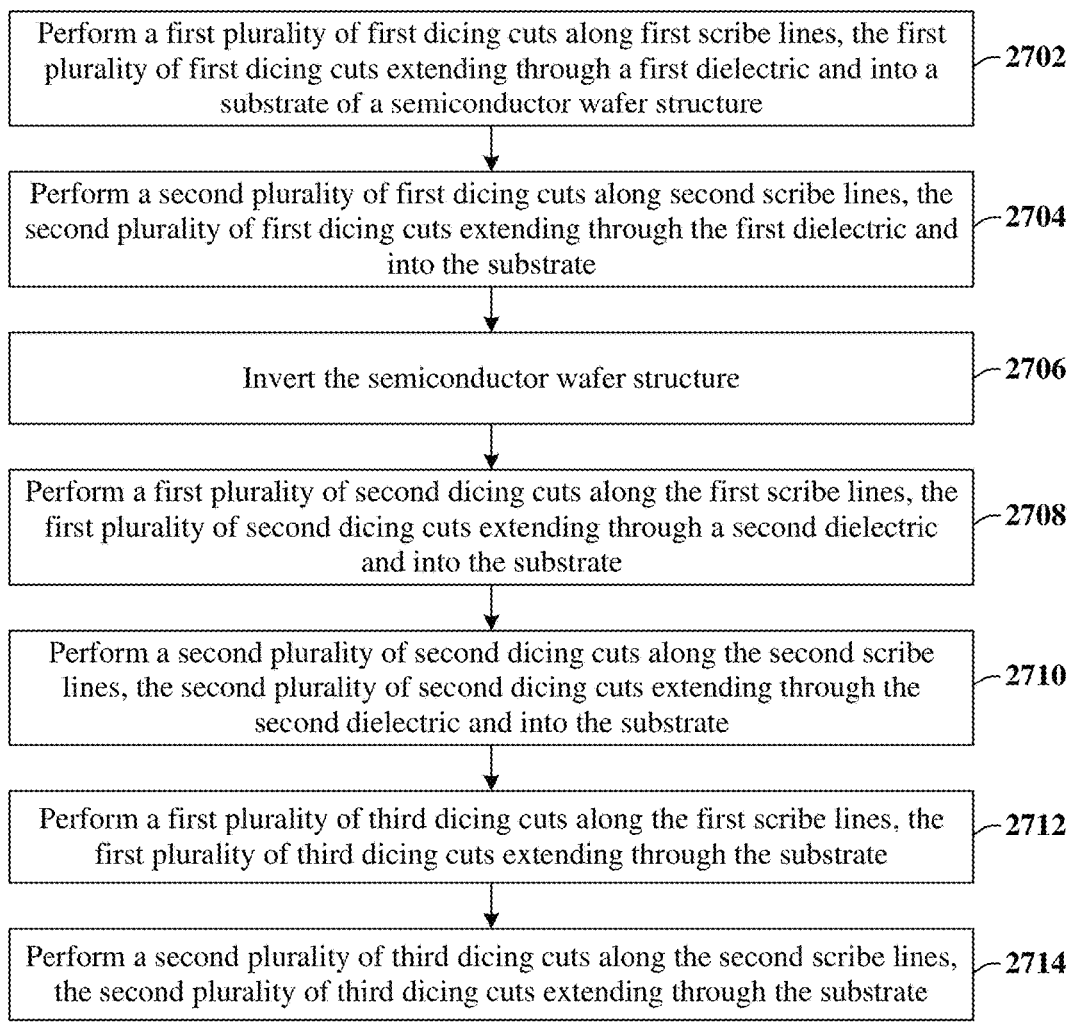
FIG. 27 illustrates a flow diagram of some embodiments of a method for dicing a semiconductor wafer structure

FIG. 27 illustrates a flow diagram of some embodiments of a method 2700 for dicing a semiconductor wafer structure. While method 2700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 2702, perform a first plurality of first dicing cuts along first scribe lines, the first plurality of first dicing cuts extending through a first dielectric and into a substrate of a semiconductor wafer structure. The first dielectric is on a first side of the substrate. The first scribe lines extend along a first direction. FIG. 20A illustrates a cross-sectional view 2000a, FIG. 20B illustrates a cross-sectional view 2000b, and FIG. 20C illustrates a top view 2000c of some embodiments corresponding to block 2702.

At block 2704, perform a second plurality of first dicing cuts along second scribe lines, the second plurality of first dicing cuts extending through the first dielectric and into the substrate. The second scribe lines extend along a second direction, different from the first direction. FIG. 21A illustrates a cross-sectional view 2100a, FIG. 21B illustrates a cross-sectional view 2100b, and FIG. 21C illustrates a top view 2100c of some embodiments corresponding to block 2704.

At block 2706, invert the semiconductor wafer structure. FIG. 22A illustrates a cross-sectional view 2200a, FIG. 22B illustrates a cross-sectional view 2200b, and FIG. 22C illustrates a top view 2200c of some embodiments corresponding to block 2706.

At block 2708, perform a first plurality of second dicing cuts along the first scribe lines, the first plurality of second dicing cuts extending through a second dielectric and into the substrate. The second dielectric is on a second side of the substrate, opposite the first side. FIG. 23A illustrates a cross-sectional view 2300a, FIG. 23B illustrates a cross-sectional view 2300b, and FIG. 23C illustrates a top view 2300c of some embodiments corresponding to block 2708.

At block 2710, perform a second plurality of second dicing cuts along the second scribe lines, the second plurality of second dicing cuts extending through the second dielectric and into the substrate. FIG. 24A illustrates a cross-sectional view 2400a, FIG. 24B illustrates a cross-sectional view 2400b, and FIG. 24C illustrates a top view 2400c of some embodiments corresponding to block 2710.

At block 2712, perform a first plurality of third dicing cuts along the first scribe lines, the first plurality of third dicing cuts extending through the substrate. For example, the first plurality of third dicing cuts extend from the second side of the substrate to the first side. FIG. 25A illustrates a cross-sectional view 2500a, FIG. 25B illustrates a cross-sectional view 2500b, and FIG. 25C illustrates a top view 2500c of some embodiments corresponding to block 2712.

At block 2714, perform a second plurality of third dicing cuts along the second scribe lines, the second plurality of third dicing cuts extending through the substrate. For example, the second plurality of third dicing cuts extend from the second side of the substrate to the first side. FIG. 26A illustrates a cross-sectional view 2600a, FIG. 26B illustrates a cross-sectional view 2600b, and FIG. 26C illustrates a top view 2600c of some embodiments corresponding to block 2714.

Thus, the present disclosure relates to a method for dicing a semiconductor wafer structure with a reduced likelihood for damage.

Accordingly, in some embodiments, the present disclosure relates to a method for forming an integrated chip. The method includes performing a first dicing cut along a first direction and extending into a semiconductor substrate from a first side of the semiconductor substrate. The method includes performing a second dicing cut along the first direction and extending into the semiconductor substrate from a second side of the semiconductor substrate, opposite the first side. The method includes performing a third dicing cut, separate from the second dicing cut, along the first direction and extending into the semiconductor substrate from the second side of the semiconductor substrate.

In other embodiments, the present disclosure relates to a method for dicing a semiconductor wafer structure. The method includes performing a first pair of first dicing cuts along a first pair of scribe lines and extending through a first dielectric structure and into a first surface of a semiconductor substrate. The first pair of first dicing cuts form a first pair of opposing sidewalls and a pair of lower cut surfaces of the semiconductor substrate. The method includes performing a first pair of second dicing cuts along the first pair of scribe lines and extending through a second dielectric structure, separate from the first dielectric structure, and into a second surface of the semiconductor substrate, opposite the first surface. The first pair of second dicing cuts form a second pair of opposing sidewalls and a pair of upper cut surfaces of the semiconductor substrate. The method includes performing a first pair of third dicing cuts, different from the first pair of second dicing cuts, along the first pair of scribe lines and extending through the semiconductor substrate from the pair of upper cut surfaces to the pair of lower cut surfaces. The first pair of third dicing cuts separate the semiconductor substrate along the first pair of scribe lines.

In yet other embodiments, the present disclosure relates to an integrated chip. The integrated chip includes a semiconductor substrate. The integrated chip includes a plurality of semiconductor devices disposed on the semiconductor substrate. The integrated chip includes a first dielectric structure over a first side of the semiconductor substrate. The integrated chip includes a second dielectric structure over a second side of the semiconductor substrate, opposite the first side. A first pair of opposing sidewalls of the semiconductor substrate are separated by a first distance. A second pair of opposing sidewalls of the semiconductor substrate are separated by a second distance. A third pair of opposing sidewalls of the semiconductor substrate are separated by a third distance. The third distance is greater than the second distance. The third pair of opposing sidewalls are over the first pair of opposing sidewalls. The second pair of opposing sidewalls are over the third pair of opposing sidewalls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
   performing a first dicing cut along a first direction and extending into a semiconductor substrate from a first side of the semiconductor substrate;
   performing a second dicing cut along the first direction and extending into the semiconductor substrate from a second side of the semiconductor substrate, opposite the first side; and
   performing a third dicing cut, separate from the second dicing cut, along the first direction and extending into the semiconductor substrate from the second side of the semiconductor substrate.

2. The method of claim 1, wherein the third dicing cut extends through the semiconductor substrate to separate the semiconductor substrate.

3. The method of claim 1, wherein a first dielectric layer is on the first side of the semiconductor substrate and a second dielectric layer is on the second side of the semiconductor substrate, wherein the first dicing cut extends through the first dielectric layer and into the semiconductor substrate, and wherein the second dicing cut extends through the second dielectric layer and into the semiconductor substrate.

4. The method of claim 3, wherein a depth of the first dicing cut is less than a depth of the third dicing cut.

5. The method of claim 1, wherein a width of the first dicing cut is different from a width of the third dicing cut.

6. The method of claim 1, wherein the first dicing cut forms a first sidewall and a lower cut surface of the semiconductor substrate, the second dicing cut forms a second sidewall and an upper cut surface of the semiconductor substrate, and the third dicing cut forms a third sidewall of the semiconductor substrate, wherein the lower cut surface laterally extends from a top of the first sidewall to a bottom of the third sidewall, wherein the upper cut surface extends laterally from a bottom of the second sidewall to a top of the third sidewall, and wherein the upper cut surface is directly over the lower cut surface.

7. The method of claim 1, further comprising:
   performing a fourth dicing cut along a second direction, different from the first direction, wherein the fourth dicing cut extends into the semiconductor substrate from the first side of the semiconductor substrate;
   performing a fifth dicing cut along the second direction and extending into the semiconductor substrate from the second side of the semiconductor substrate; and
   performing a sixth dicing cut along the second direction and extending through the semiconductor substrate from the second side of the semiconductor substrate to the first side of the semiconductor substrate.

8. The method of claim 7, wherein a depth of the fourth dicing cut is approximately equal to a depth of the first dicing cut.

9. A method for dicing a semiconductor wafer structure, the method comprising:
   performing a first pair of first dicing cuts along a first pair of scribe lines and extending through a first dielectric structure and into a first surface of a semiconductor substrate, wherein the first pair of first dicing cuts form a first pair of opposing sidewalls and a pair of lower cut surfaces of the semiconductor substrate;
   performing a first pair of second dicing cuts along the first pair of scribe lines and extending through a second dielectric structure, separate from the first dielectric structure, and into a second surface of the semiconductor substrate, opposite the first surface, wherein the first pair of second dicing cuts form a second pair of opposing sidewalls and a pair of upper cut surfaces of the semiconductor substrate; and
   performing a first pair of third dicing cuts, different from the first pair of second dicing cuts, along the first pair of scribe lines and extending through the semiconductor substrate from the pair of upper cut surfaces to the pair of lower cut surfaces, wherein the first pair of third dicing cuts separate the semiconductor substrate along the first pair of scribe lines.

10. The method of claim 9, wherein distances between the pair of upper cut surfaces and the pair of lower cut surfaces are greater than distances between the pair of lower cut surfaces and the first surface of the semiconductor substrate.

11. The method of claim 9, wherein the first pair of third dicing cuts form a third pair of opposing sidewalls that extend from the pair of upper cut surfaces to the pair of lower cut surfaces, respectively.

12. The method of claim 11, wherein a distance between the second pair of opposing sidewalls is less than a distance between the third pair of opposing sidewalls, and wherein a distance between the first pair of opposing sidewalls is less than the distance between the second pair of opposing sidewalls.

13. The method of claim 11, wherein a distance between the second pair of opposing sidewalls is less than a distance between the third pair of opposing sidewalls, and wherein a distance between the first pair of opposing sidewalls is approximately equal to the distance between the second pair of opposing sidewalls.

14. The method of claim 11, wherein a distance between the second pair of opposing sidewalls is less than a distance between the third pair of opposing sidewalls, and wherein a distance between the first pair of opposing sidewalls is greater than the distance between the second pair of opposing sidewalls.

15. The method of claim 9, wherein the first pair of scribe lines extend along a first direction, and wherein the method further comprises:
   performing a second pair of first dicing cuts along a second pair of scribe lines and extending through the first dielectric structure and into the first surface of the semiconductor substrate, wherein the second pair of scribe lines extend along a second direction, different from the first direction;
   performing a second pair of second dicing cuts along the second pair of scribe lines and extending through the second dielectric structure and into the second surface of the semiconductor substrate; and
   performing a second pair of third dicing cuts, different from the second pair of second dicing cuts, along the second pair of scribe lines and extending through the semiconductor substrate, wherein the second pair of third dicing cuts separate the semiconductor substrate along the second pair of scribe lines.

16. The method of claim 15, wherein the first pair of first dicing cuts and the second pair of first dicing cuts are performed with a first dicing blade, the first pair of second dicing cuts and the second pair of second dicing cuts are performed with a second dicing blade, and the first pair of third dicing cuts and the second pair of third dicing cuts are performed with a third dicing blade, and wherein the first dicing blade is different from the third dicing blade.

17. A method for forming an integrated chip, the method comprising:
    performing a first dicing cut into a first side of a substrate and along a first scribe line to form a first recess in the substrate and along the first scribe line, the first recess having a first depth;
    performing a second dicing cut into a second side of the substrate and along the first scribe line to form a second recess in the substrate and along the first scribe line, the second recess spaced over the first recess, the second recess having a second depth greater than the first depth; and
    performing a third dicing cut into the substrate and along the first scribe line, the third dicing cut extending from the second recess to the first recess.

18. The method of claim 17, further comprising:
    performing a fourth dicing cut into the first side of the substrate and along a second scribe line, transverse to the first scribe line, to form a third recess in the substrate and along the second scribe line, the third recess having a third depth;
    performing a fifth dicing cut into the second side of the substrate and along the second scribe line to form a fourth recess in the substrate and along the second scribe line, the fourth recess spaced over the third recess, the fourth recess having a fourth depth greater than the third depth; and
    performing a sixth dicing cut into the substrate and along the second scribe line, the sixth dicing cut extending from the fourth recess to the third recess.

19. The method of claim 17, wherein a width of the second dicing cut is greater than a width of the third dicing cut, and wherein a width of the first dicing cut is different than the width of the third dicing cut.

20. The method of claim 19, wherein the width of the first dicing cut is greater than the width of the third dicing cut.

* * * * *